(12) United States Patent
Babayan et al.

(10) Patent No.: US 7,329,608 B2
(45) Date of Patent: Feb. 12, 2008

(54) METHOD OF PROCESSING A SUBSTRATE

(75) Inventors: Steven E. Babayan, Huntington Beach, CA (US); Robert F. Hicks, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 136 days.

(21) Appl. No.: 10/982,120

(22) Filed: Nov. 5, 2004

(65) Prior Publication Data

US 2005/0093458 A1 May 5, 2005

Related U.S. Application Data

(63) Continuation of application No. 09/567,851, filed on May 9, 2000.

(60) Provisional application No. 60/134,353, filed on May 14, 1999.

(51) Int. Cl.
*H01L 21/3065* (2006.01)

(52) U.S. Cl. ............ 438/689; 438/692; 438/706; 438/710; 438/712; 156/345.45; 118/723; 427/535; 427/576; 427/577

(58) Field of Classification Search ............. 438/689; 156/345.45; 118/723; 427/535
See application file for complete search history.

(56) References Cited

U.S. PATENT DOCUMENTS 4,434,742 A    3/1984 Henaff et al.
(Continued)

FOREIGN PATENT DOCUMENTS

EP         0431951         6/1991
(Continued)

OTHER PUBLICATIONS

Y.Kokaku, Janpan Int'l Electronics Manufacturing Technology Symposium pp. 18-21, (1993).*
(Continued)

*Primary Examiner*—Nadine G. Norton
*Assistant Examiner*—Maki Angadi
(74) *Attorney, Agent, or Firm*—Venable LLP; Michael A. Gollin; Lars H. Genieser

(57) ABSTRACT

The invention is embodied in a plasma flow device or reactor having a housing that contains conductive electrodes with openings to allow gas to flow through or around them, where one or more of the electrodes are powered by an RF source and one or more are grounded, and a substrate or work piece is placed in the gas flow downstream of the electrodes, such that said substrate or work piece is substantially uniformly contacted across a large surface area with the reactive gases emanating therefrom. The invention is also embodied in a plasma flow device or reactor having a housing that contains conductive electrodes with openings to allow gas to flow through or around them, where one or more of the electrodes are powered by an RF source and one or more are grounded, and one of the grounded electrodes contains a means of mixing in other chemical precursors to combine with the plasma stream, and a substrate or work piece placed in the gas flow downstream of the electrodes, such that said substrate or work piece is contacted by the reactive gases emanating therefrom. In one embodiment, the plasma flow device removes organic materials from a substrate or work piece, and is a stripping or cleaning device. In another embodiment, the plasma flow device kills biological microorganisms on a substrate or work piece, and is a sterilization device. In another embodiment, the plasma flow device activates the surface of a substrate or work piece, and is a surface activation device. In another embodiment, the plasma flow device etches materials from a substrate or work piece, and is a plasma etcher. In another embodiment, the plasma flow device deposits thin films onto a substrate or work piece, and is a plasma-enhanced chemical vapor deposition device or reactor.

32 Claims, 15 Drawing Sheets

U.S. PATENT DOCUMENTS

| | | | |
|---|---|---|---|
| 4,659,449 | A | 4/1987 | Watanabe |
| 4,904,621 | A | 2/1990 | Loewenstein et al. |
| 4,957,062 | A | 9/1990 | Schuurmans et al. |
| 5,185,132 | A | 2/1993 | Horlike et al. |
| 5,272,417 | A | 12/1993 | Ohmi |
| 5,368,897 | A | 11/1994 | Kurihara et al. |
| 5,387,842 | A | 2/1995 | Roth et al. |
| 5,391,855 | A | 2/1995 | Tanisaki |
| 5,414,324 | A | 5/1995 | Roth et al. |
| 5,456,972 | A | 10/1995 | Roth et al. |
| 5,464,476 | A | 11/1995 | Gibb et al. |
| 5,518,572 | A | 5/1996 | Kinoshita et al. |
| 5,558,843 | A | 9/1996 | Glocker et al. |
| 5,562,841 | A | 10/1996 | Kulik et al. |
| 5,669,583 | A | 9/1997 | Roth |
| 5,714,308 | A | 2/1998 | Romach et al. |
| 5,733,610 | A | 3/1998 | Okazaki et al. |
| 5,734,143 | A | 3/1998 | Kawase et al. |
| 5,767,469 | A | 6/1998 | Glocker et al. |
| 5,789,145 | A | 8/1998 | Glocker et al. |
| 5,793,013 | A | 8/1998 | Read et al. |
| 5,795,452 | A | 8/1998 | Kinoshita et al. |
| 5,853,815 | A | 12/1998 | Muehlberger |
| 5,865,896 | A | 2/1999 | Nowak et al. |
| 5,888,713 | A | 3/1999 | Arrington et al. |
| 5,908,602 | A | 6/1999 | Bárdos et al. |
| 5,928,527 | A | 7/1999 | Li et al. |
| 5,938,854 | A | 8/1999 | Roth |
| 5,961,772 | A | 10/1999 | Selwyn |
| 5,965,040 | A | 10/1999 | Luo et al. |
| 5,973,289 | A | 10/1999 | Read et al. |
| 5,977,715 | A | 11/1999 | Li et al. |
| 5,985,378 | A | 11/1999 | Paquet |
| 6,039,834 | A | 3/2000 | Tanake et al. |
| 6,099,687 | A | 8/2000 | Yamazaki |
| 6,194,036 | B1 | 2/2001 | Babayan et al. |
| 6,213,049 | B1 | 4/2001 | Yang |
| 6,228,330 | B1 | 5/2001 | Herrmann et al. |
| 6,262,523 | B1 | 7/2001 | Selwyn et al. |
| 6,482,476 | B1* | 11/2002 | Liu .......................... 427/535 |
| 6,645,828 | B1 | 11/2003 | Farrens et al. |

FOREIGN PATENT DOCUMENTS

| | | | |
|---|---|---|---|
| EP | 0665306 | | 8/1995 |
| EP | 0780491 | | 6/1997 |
| JP | 04338196 | A | 11/1992 |
| JP | 06-158331 | | 6/1994 |
| JP | 158331 | | 6/1994 |
| JP | 7-37870 | | 2/1995 |
| JP | 07037870 | * | 7/1995 |

OTHER PUBLICATIONS

G.S.Selwyn, Physics Division Progress Report (1999-2000), pp. 189-197.*

A.Schutze, IEEE Transactions on Plasma Science, vol. 26, No. 6, Dec. 1998 pp. 16851694.*

Lieberman and Lichtenberg, "Principles of Plasma Discharges and Materials Processing," John Wiley & Sons, Inc., New York (1994).

Patrick et al., "Plasma-Enhanced Chemical Vapor Deposition of Silicon Dioxide Films Using Tetraethoxysilane and Oxygen: Characterization and Properties of Films," J. Electrochem. Soc. 139:2604-2613 (1992).

Kuo, Reactive Ion Etching of Sputter Deposited Tantalum with $CF_4$, $CF_3Cl$ and $CHF_3$, Jpn. J. Appl. Phys. 32:179-185 (1993).

Schutze et al., IEEE Transactions on Plasma Science, 26(6):1685-1694 (1998).

Fauchais and Vardelle, "Thermal Plasmas," IEEE Transactions on Plasma Science, 25:1258-1280 (1997).

Goldman and Sigmond, "Corona and Insulation," IEEE Transactions on Electrical Insulation, EI-17(2):90-105 (1982).

Eliasson and Kogelschatz, "Nonequilibrium Volume Plasma Chemical Processing," IEEE Transactions on Plasma Science, 19:1063-1077 (1991).

Koinuma et al., "Development and Application of a Microbeam Plasma Generator," Appl. Phys. Lett., 60:816-817 (1992).

Jeong et al., "Etching Materials with an Atmospheric-Pressure Plasma Jet," Plasma Sources Science Technol., 7:282-285 (1998).

Babayan et al., "Deposition of Silicon Dioxide Films with an Atmospheric-Pressure Plasma Jet," Plasma Sources Science Technol. 7:286-288 (1998).

J.Y. Jeong et al., "Etching polyimide with a nonequilibrium atmospheric-pressure plasma jet," J. Vac. Sci. Technol., A 17(5):2581:2585, 1999.

S.K. Ray et al., "TEOS-based PECVD of silicon dioxide for VLSI applications," Advance Materials for Optics and Electronics, 6:73-82, 1996.

C. Apblett et al., "Silicon nitride growth in a high-density plasma system," Solid State Technology, 38(11):73-80, 1995.

D. Landheer et al., "Growth and characertization of silicon nitride films produced by remote microwave plasma chemical vapor deposition," Journal of Vacuum Science and Technology A., 9(5):2594-2601, 1991.

D.L. Flamm et al., Plasma Eching, An Introduction, edited by D.M. Manos and D.L. Flamm, San Diego, CA: Academic Press, pp. 1-7, 1989.

R.W. Smith et al., "Thermal Plasma Materials Processing-Applications and Opportunities," Plasma Chemistry and Plasma Processing, 9(1):135S-165S, 1989.

J. Heberlein et al., Thermal Plasma Chemical Vapor Deposition, Materials Science Forum, J.J. Pouch, S.A. Alterovitz, Ed., Trans Tech Publications Ltd., Aedermannsdorf Switzerland, 140-142:477, 1993.

Y. Chang et al., "Silicon Nitride Synthesis in an Atmospheric Pressure Convection-Stabilized Arc," Plasma Chemistry and Plasma Processing, 9(2):277-289, 1989.

Z.P. Lu et al., "Diamond Synthesis by Thermal Plasma CVD at 1 atm," Plasma Chemistry and Plasma Processing, 11(3):387, 1991.

Hicks, R. et al., "Materials Processing with Atmospheric-Pressure Plasma Jets", Plasma Science, 1998, 25th Anniversary, IEEE Conference Record—Abstracts; 1998 IEEE International Conference, New York, NY, Jun. 1, 1998, p. 178. XP010283442.

T. J. Coutts, et al. "Transparent Conducting oxides: Status and opportunities in Basic Research", *National Renewable Energy Laboratory: Conference Paper.* Aug. 1999, NREL/CP-520-26640.

D. Mardare, et al. "On the structural properties and optical transmittance of $TiO_2$ r.f. sputtered thin films", *Appl. Surf. Sci.* 156, 200 (2000).

T. David, et al. "p-Type Sb-doped ZnO Thin Films Prepared with Filtered Vacuum Arc Deposition", *Vacuum Technology & Coating*, 40-45 (Apr. 2005).

Tong and Gösele, "Semiconductor Wafer Bonding: Science and Technology" (Wiley-Interscience, New York, 1998), Table of Contents on http://www.wiley.com/WileyCDA/WileyTitle/productCd-0471574813,descCd-tableOfContents.html (accessed Jul. 11, 2007).

Iyer and Aubreton-Herve, Silicon Wafer Bonding Technology for VLSI and MEMS Applications (IEEE Inspec, New York, 2002), Table of Contents on http://www.iee.org/Publish/Books/Emisp/Ep001c.cfm (accessed Jul. 11, 2007).

S. Blackstone, "Recent Advances in Wafer Bonding of Silicon and Alternative Materials", *Microelectronic Engineering*, vol. 48., p. 313, 1999.

W.P. Maszara, et al. "Bonding of silicon wafers for silicon-on-insulator," Journal of Applied Physics, vol. 64, No. 10, Nov. 15, 1988, p. 4943.

* cited by examiner

METHOD OF PROCESSING A SUBSTRATE

CROSS-REFERENCE TO RELATED APPLICATIONS

This application claims priority under 35 U.S.C. § 119(e) of U.S. Provisional Patent Application No. 60/134,353, filed May 14, 1999, entitled "PLASMA FLOW DEVICE," by Steven E. Babayan et al., which application is incorporated by reference herein.

This application is a continuation of application Ser. No. 09/567,851, filed May 9, 2000, by Steven B. Babayan and Robert F. Hicks, entitled "LOW-TEMPERATURE COMPATIBLE WIDE-PRESSURE-RANGE PLASMA FLOW DEVICE", which claims the benefit of provisional Application Ser. No. 60/134,353, filed May 14, 1999 by Steven E. Babayan and Robert F. Hicks, entitled "PLASMA FLOW DEVICE".

STATEMENT REGARDING FEDERALLY SPONSORED RESEARCH OR DEVELOPMENT

This invention was made with Government support under Grant No. DE-F5607-96ER-45621, awarded by the U.S. Department of Energy, Basic Energy Sciences. The Government has certain rights in this invention.

BACKGROUND OF THE INVENTION

1. Field of the Invention

The invention is related to plasma devices or reactors that are used for cleaning, sterilization, surface activation, etching and thin-film deposition, and in particular to a low-temperature compatible, wide-pressure-range plasma flow device.

2. Description of the Related Art

Plasmas have found wide application in materials processing. For example, plasmas play a key role in the manufacture of integrated circuits and other semiconductor products. Plasmas that are used in materials processing are generally weakly ionized, meaning that less than 1% of the molecules in the gas are charged. In addition to the ions, these plasmas contain reactive species that can etch and deposit thin films at rates up to about a micron per minute. The temperature in these weakly ionized gases is usually below 200° C., so that thermally sensitive substrates are not damaged.

In some cases, the ions produced in the plasma can be accelerated towards a substrate to cause directional etching of sub-micron features into the material. In other cases, the plasma is designed so that most of the ions are kept away from the substrate leaving mainly neutral chemical species to contact it. Here, the goal is to isotropically etch the substrate, such as in the stripping of photoresist from silicon wafers. For a general description of weakly ionized plasmas, see Lieberman and Lichtenberg, "Principles of Plasma Discharges and Materials Processing", (John Wiley & Sons, Inc., New York, 1994).

An important application of plasmas is the chemical vapor deposition (CVD) of thin films. The plasma enhances the CVD process by providing reactive species which attack the chemical precursors, causing them to decompose and deposit the material at a much lower temperature than is otherwise possible by thermal activation. See for example, Patrick, et al., "Plasma-Enhanced Chemical Vapor Deposition of Silicon Dioxide Films Using Tetraethoxysilane and Oxygen: Characterization and Properties of Films", J. Electrochem Soc. 139, 2604-2613 (1992). In most applications, the ions are kept away from the chemical precursors as much as possible, because the ions may cause non-selective decomposition with the incorporation of unwanted impurities into the CVD film. In some applications, the ions are mixed with the precursors to provide a specialized process whereby the film is slowly etched at the same time it is deposited. This configuration can be useful for depositing material deep inside sub-micron trenches. However, in this case, ion-induced damage of the substrate may occur.

The literature teaches that weakly ionized plasmas are generated at low gas pressures, between about 0.001 to 1.0 Torr, by the application of radio-frequency (RF) power to a conducting electrode (see Lieberman and Lichtenberg (1994)). Sometimes microwave power is used instead of RF. The electrode may be designed to provide either capacitive or inductive coupling to strike and maintain the plasma. In the former case, two solid conducting electrodes are mounted inside a vacuum chamber, which is filled with the plasma. One of these electrodes is powered, or biased, by the RF generator, while the other one is grounded. In the latter case, the RF power is supplied through an antenna that is wrapped in a coil around the insulating walls of the vacuum chamber. The oscillating electric field from the coil penetrates into the gas inducing its ionization. U.S. Pat. No. 5,865,896 to Nowak, et al. Feb. 2, 1999) gives an example of such a design.

The substrate or work piece that is being treated by the plasma sits on a pedestal mounted inside the vacuum chamber. The pedestal may be grounded or at a floating potential, or may be separately biased from the RF powered electrode or antenna. The choice depends on the application (see Nowak et al. (1999)). There are also applications in which the electrodes are suspended away from the substrate or work piece so as to minimize contact with the ions. In these cases, the plasma is operated at pressures near 1.0 to 10.0 Torr, where the reactive neutral species exhibit much longer lifetimes in the plasma than the ions.

A disadvantage of plasmas operating at low pressures is that the concentration of reactive species can be too low to give the desired etching or deposition rate. For example, it has been shown by Kuo ("Reactive Ion Etching of Sputter Deposited Tantalum with $CF_4$, $CF_3Cl$ and $CHF_3$", Jpn. J. Appl. Phys. 32, 179-185 (1993)) that sputter deposited tungsten films are etched at a maximum of 0.22 microns per minute, using 100 mTorr carbon tetrafluoride at 60° C. Rates at ten times higher than this are desirable for commercial manufacturing operations. Another disadvantage of low-pressure plasmas is that they are difficult to scale up to treat objects that are larger than about a square foot in area. The flux of ions and other reactive species to the substrate or work piece is a sensitive function of the density of charged particles in the plasma. The plasma density at any point within the vacuum chamber depends on the local electric field. This field is sensitive to the shape and composition of the vacuum chamber, the shape and composition of the work piece and the pedestal that holds it, the design of the electrode or antenna, and many other factors. Therefore, designing a plasma reactor requires many hours of engineering and experimentation, all of which greatly adds to the cost of the device.

A further disadvantage of low-pressure plasmas is that the reactive gas fills the entire volume inside the vacuum chamber. In these devices, it is impossible to completely separate the ions from the neutral reactive species. Ions always impinge on the substrate, and may cause damage, if, for example, it contains sensitive electronic devices, such as solid-state transistors. The ions and reactive gases may also damage the chamber and other system components, including the substrate holder, the gas injection rings, the electrodes, and any quartz dielectric parts. In plasma-enhanced chemical vapor deposition reactors, the films are deposited all over the inside of the chamber. These deposits alter the characteristics of the plasma as well as lead to particulate contamination problems. Consequently, plasma CVD reactors must be cleaned periodically to eliminate these residues. These deposits can be removed by introducing an etchant gas, such as $NF_3$, into the chamber and striking a plasma. However, the residues are of different thickness and their rates of etching may not be uniform, making it difficult to satisfactorily clean all the surfaces. See Nowak et al. (1999). Ultimately, the CVD reactor must be taken out of service, cleaned by hand and the damaged parts replaced. These cleaning operations add to the cost of operating the plasma device and are a significant disadvantage.

Thus, there is a need for a plasma device that can provide higher fluxes of reactive species to increase etching and deposition rates, that is easily scaled up to treat large areas, that if needed, can eliminate the impingement of ions onto the substrate or work piece, and that confines the reactive gas flux primarily to the object being treated. The latter property would reduce the wear and tear on the device, and greatly reduce the need for reactor cleaning.

One way to increase the flux of reactive species in a plasma is to increase the total pressure. In this regard, several plasma devices have been developed for operation at atmospheric pressure. A discussion of these sources is given in Schutze et al., IEEE Transactions on Plasma Science, Vol. 26, No. 6, 1998, pp. 1685-1694, which is incorporated by reference herein. While these devices can provide high concentrations of reactants for etching and deposition, they have other disadvantages that make them unsuitable for many materials applications. The most common atmospheric-pressure plasma is the torch, or transferred arc, which is described by Fauchais and Vardelle, in their article: "Thermal Plasmas", IEEE Transactions on Plasma Science, 25, 1258-1280 (1997). In these devices, the gas is completely ionized and forms an arc between the powered and grounded electrodes. The gas temperature inside the arc is more than ten thousand degrees Centigrade. This device may be used for processing materials at high temperatures, such as in metal welding, but is not useful for etching and depositing thin films as described in the preceding paragraphs.

To prevent arcing and lower the gas temperature in atmospheric-pressure plasmas, several schemes have been devised, such as the use of pointed electrodes in corona discharges and insulating inserts in dielectric barrier discharges. See Goldman and Sigmond, "Corona and Insulation," IEEE Transactions on Electrical Insulation, EI-17, no. 2, 90-105 (1982) and Eliasson and Kogelschatz, "Nonequilibrium Volume Plasma Chemical Processing", IEEE Transactions on Plasma Science, 19, 1063-1077, (1991). A drawback of these devices is that the plasmas are not uniform throughout the space between the electrodes. In addition, they do not produce the same reactive chemical species as are present in low-pressure plasmas of similar gas composition.

A cold plasma torch described by Koinuma et al. in their article: "Development and Application of a Microbeam Plasma Generator," Appl. Phys. Lett., 60, 816-817 (1992). This device operates at atmospheric pressure, and can be used to etch or deposit thin films. In the cold plasma torch, a powered electrode, consisting of a metal needle 1 millimeter (mm) in thickness, is inserted into a grounded metal cylinder, and RF power is applied to strike and maintain the plasma. In addition, a quartz tube is placed between the cathode and anode, which makes this device resemble a dielectric barrier discharge. An atmospheric-pressure plasma jet is described by Jeong et al., "Etching Materials with an Atmospheric-Pressure Plasma Jet," Plasma Sources Science Technol., 7,282-285 (1998), and by Babayan et al., "Deposition of Silicon Dioxide Films with an Atmospheric-Pressure Plasma Jet," Plasma Sources Science Technol., 7, 286-288, (1998), as well as in U.S. Pat. No. 5,961,772 issued to Selwyn, all of which are incorporated by reference herein. The plasma jet consists of two concentric metal electrodes, the inner one biased with RF power and the outer one grounded. This device uses flowing helium and a special electrode design to prevent arcing. By adding small concentrations of other reactants to the helium, such as oxygen or carbon tetrafluoride, the plasma jet can etch and deposit materials at a low temperature, similar to that achieved in low-pressure capacitively and inductively coupled plasma discharges. The cold plasma torch and the plasma jet provide a beam of reactive gas that impinges on a spot on a substrate. These designs have a serious drawback in that they do not treat large areas uniformly. Scaling them up to cover larger areas, such as a square foot of material, is not straightforward and may not be possible. The operation of these plasma devices at pressures other than one atmosphere of pressure has not been described.

Thus, there is a need for a plasma device that operates at pressures ranging from 10.0 to 1000.0 Torr (1.0 Atmosphere=760 Torr), that can provide higher fluxes of reactive aspecies to increase etching and deposition rates, that is easily scaled up to treat large areas, that if needed, can eliminate the impingement of ions onto the substrate or work piece, and that confines the reactive gas flux primarily to the object being treated.

SUMMARY OF THE INVENTION

To overcome the limitations in the prior art described above, and to overcome other limitations that will become apparent upon reading and understanding the present specification, the present invention discloses a method for creating a plasma and a plasma flow device. The method comprises providing a gas flow, coupling a signal generator to a first electrode wherein the first electrode is electrically insulated from a second electrode, and exciting ions in the gas flow to create a plasma therefrom, wherein the plasma can be produced with a substantially uniform flux of a reactive specie over an area larger than 1 $cm^2$.

The device comprises a housing, wherein the housing provides a gas flow, a first electrode, electrically insulated from the housing, a second electrode, spaced from the first electrode and electrically insulated from the first electrode and electrically insulated from the housing, and a signal generator, coupled to the first electrode, wherein the signal generator excites ions in the gas flow to create a plasma therefrom substantially between the first electrode and the second electrode, wherein the plasma can be produced with a substantially uniform flux of a reactive specie over an area larger than 1 $cm^2$.

Various advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

Figure 1:
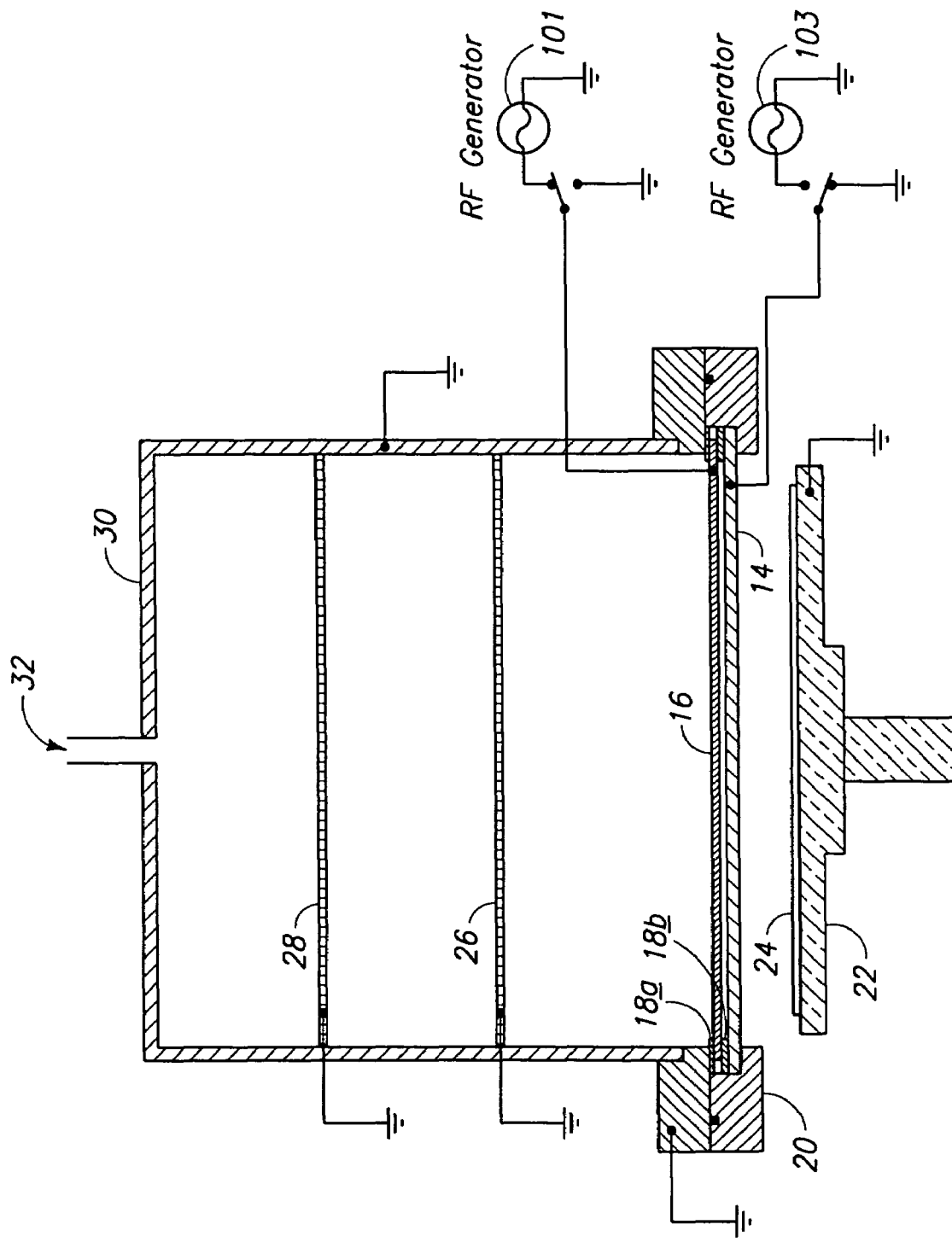
FIG. 1 is a cross-sectional view of a plasma device in accordance with the present invention.

In the following description of the preferred embodiment, reference is made to the accompanying drawings which form a part hereof, and in which is shown by way of illustration the specific embodiment in which the invention may be practiced. It is to be understood that other embodiments may be utilized and structural and functional changes may be made without departing from the scope of the present invention.

Overview

The invention is embodied in a plasma flow device or reactor having a housing that contains conductive electrodes with openings to allow gas to flow through or around them, where one or more of the electrodes are powered by an RF source and one or more are grounded, and a substrate or work piece is placed in the gas flow downstream of the electrodes, such that said substrate or work piece is substantially uniformly contacted with the reactive gases emanating therefrom over a large surface area of the substrate. The invention is also embodied in a plasma flow device or reactor having a housing that contains conductive electrodes with openings to allow gas to flow through or around them, where one or more of the electrodes are powered by an RF source and one or more are typically grounded, and one of the grounded electrodes contains a means of mixing in other chemical compounds to combine with the plasma stream, and a substrate or work piece is placed in the gas flow downstream of the electrodes, such that said substrate or work piece is substantially uniformly contacted with the reactive gases emanating therefrom The housing can have a variety of different sizes and shapes, but generally has a cross-sectional area for flow that is similar in size to the substrate being treated. The electrodes span the inside of the housing perpendicular to the flow direction, and have openings to allow the gas to flow through or around them. The openings can be of many types, including perforations, slits, or small gaps, but preferably such that the gas maintains intimate contact with the electrodes, and passes by their surfaces at a high flow velocity. The electrodes are alternately grounded and biased with RF power, causing a plasma to be maintained between them. The invention is also embodied in a plasma flow device or reactor that is used for cleaning, for sterilization, for surface activation, for etching, for plasma-enhanced chemical vapor deposition of thin films, or for other materials processing applications.

The invention as embodied herein operates at pressures ranging from 10 Torr to 5000 Torr, provides high fluxes of at least one reactive specie for materials processing, is easily scaled up to treat larger areas, and confines the reactive gas primarily to the object being treated. The invention as embodied herein uniformly etches or deposits thin films simultaneously over a large surface area, e.g., greater than 1 $cm^2$, and at high rates of typically 0.5 to 10.0 microns per minute, thereby offering significant advantages over the prior art. Since the invention confines the reactive gas flux to the object being treated, the equipment itself is subject to less damage and is easier to clean, making the plasma flow device less expensive, more reliable, and easier to operate than alternative low-pressure plasmas. In one embodiment, the invention confines the plasma to the powered and grounded electrodes, so that, for the most part, only neutral reactive species contact the substrate or work piece, thus avoiding ion bombardment and any significant ion-induced damage of the substrate or work piece.

Device for Processing Disc-Shaped Substrates

The basic elements of the invention are illustrated in FIG. 1. Although the device depicted is designed to process disc-shaped substrates, other geometric designs for treating objects of different shapes (e.g. rectangular, cylindrical, etc.) are equivalent and would have the same elements. Some of these other designs are described below as additional embodiments.

Referring to FIG. 1, process gas enters through a tube 32 attached to one end of a cylindrical housing 30. Two perforated sheets 26 and 28 mounted inside the housing 30 make the gas flow uniformly down through the cavity. An upper conductive electrode 16, two dielectric spacers 18a and 18b, and a lower conductive electrode 14 are clamped together with a clamp ring 20. The dielectric spacer 18a isolates the upper electrode 16 from the housing 30, which is grounded. The dielectric spacer 18b creates a gap between the upper and lower electrodes 16 and 14. In the drawing in FIG. 1, electrode 14 is switched to ground, and radio frequency (RF) power at 13.56 megahertz is applied to electrode 16, causing a plasma to be generated and maintained between them. Other frequencies of RF power can be used without departing from the scope of the present invention. Gas flowing down through the housing 30 passes through openings in the upper and lower electrodes 16 and 14, is converted into a plasma, and flows out of an outlet in housing 30, that is, flows out of the device contacting substrate 24 located on pedestal 22. The plasma or plasma effluent cleans, sterilizes, surface activates, etches, or deposits material on the substrate 24, depending on the composition of the gas fed to the device.

The plasma flow device depicted in FIG. 1 has no substrate processing chamber, and the plasma flow device is operable without a substrate processing chamber. As shown, plasma effluent flows out of the plasma flow device to impinge on a substrate 24 that is not contained within a processing chamber, and is separate from the device.

Any size disc-shaped substrate can be processed with this invention simply by adjusting the diameter of the housing 30 to be slightly larger than that of the substrate 24. As an example to illustrate the utility of the plasma flow device, and by no means to limit the scope of the invention, the housing 30 could be 7, 9 or 13 inches in diameter, and the substrate 24 could be silicon wafers 6, 8 or 12 inches in diameter. Further, other shapes for the housing, such as square, rectangular, octagonal, hexagonal, or other geometries can be used to provide a proper housing 30 to process any shaped substrate 24.

Using the switches shown in FIG. 1, radio frequency power may be applied to electrode 16, and electrode 14 grounded, or vice versa to electrode 14, and electrode 16 grounded. FIG. 1 illustrates the case where the upper electrode 16 is biased with the RF. This is preferred in applications where it is desired to avoid ion bombardment of the substrate. In addition, this configuration prevents leakage of RF radiation out of the device. In other embodiments, it may be preferred for the lower electrode 14 to be biased by RF power, for example, where it is desired to enhance etching rates through ion bombardment of the substrate. In this case, the upper electrode 16 may be grounded, yielding a plasma in the gas space between the electrodes 14 and 16.

Although the present invention is described with a single pair of electrodes 14 and 16, the present invention can use multiple pairs of electrodes 14 and 16, each pair of electrodes 14 and 16 being connected to a separate RF generator 101, such that across the surface of the substrate 24, different plasma flows can be created. Further, the multiple pairs of electrodes 14 and 16 can be placed in a sequential manner, e.g., side by side, at right angles, etc., or can be placed in a concentric manner, e.g., one pair in the middle and another pair toroidally surrounding the first pair, or in other geometric fashions or combinations of geometric fashions to create the desired plasma flow.

Alternatively, RF power may be applied to electrode 14 and the substrate 24 may be grounded, yielding a plasma in the gas space between electrode 14 and substrate 24. In another embodiment, both electrode 16 and substrate 24 may be grounded, generating a plasma in the gaps between the upper electrode 16, the lower powered electrode 14, and the substrate 24. Though not indicated in FIG. 1, the RF power is passed through an impedance matching network before entering the device. Power generators used for the present invention are commercially available and deliver 13.56 MHz power typically at 50 or 75 Ohm impedance. It is not essential to use RF power to practice this invention. Other power sources operating at different frequencies may be employed to ionize the gas, such as for example, the use of microwaves.

The spacing of the electrodes must be carefully chosen to achieve a stable plasma in between them. The width of the gap depends on the electrode design, the operating pressure of the device, and the gas composition used, and is typically between 0.1 and 20 mm. For operation at atmospheric pressure and with most gas compositions, a narrower gap in the range of 0.5 to 3 mm is preferred. A larger spacing between the electrodes is typically preferred for operation at pressures below one atmosphere.

Electrode Design

Figure 2:
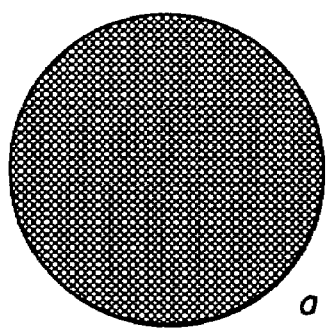
FIGS. 2a-2h illustrate different electrodes that may be used with the plasma device described in FIG. 1.
Figure 2:
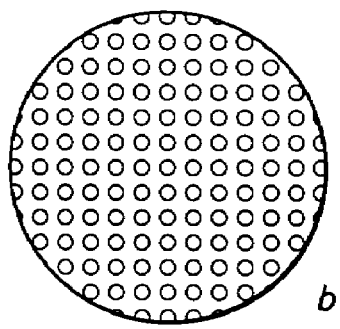
Figure 2:
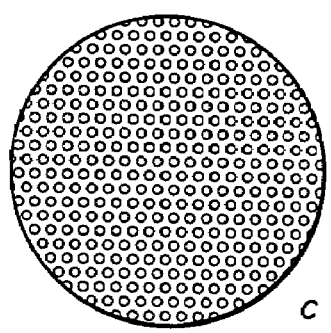
Figure 2:
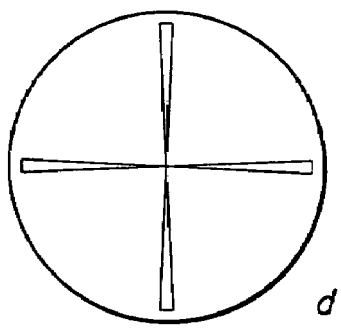
Figure 2:
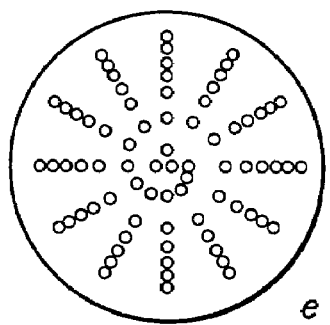
Figure 2:
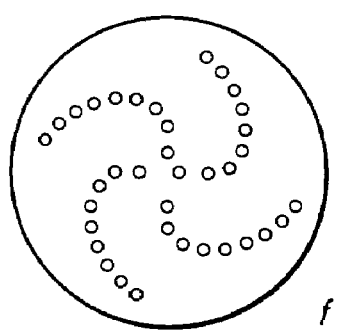
Figure 2:
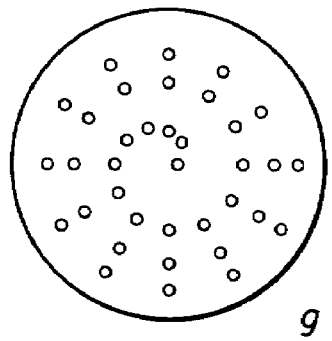
Figure 2:
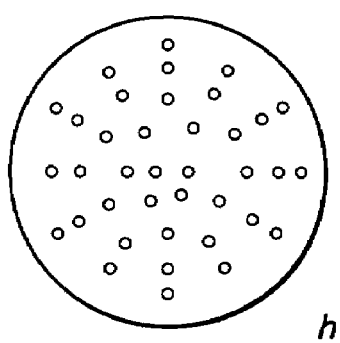

Many different designs for the conductive electrodes may be used with the invention described herein. Some examples of these designs are presented in FIG. 2. It is preferred that the gases intimately contact the upper electrode 16 so that efficient mixing occurs between the gas near the electrode surface and that in the main stream. This mixing promotes rapid heat and mass transfer which is desirable for efficient operation of the device. A preferred embodiment of the upper electrode is a series of small perforations, between 0.01 and 0.10 inches in diameter, as illustrated in FIGS. 2a, 2b and 2c. The lower electrode 14 is designed to provide stable operation of the plasma as well as uniform and intimate contacting of the plasma or plasma effluent with the substrate 24. Since the reactive species in the plasma effluent are rapidly consumed with distance, the linear velocity of the gas exiting the lower electrode 14 should be high. This velocity equals the volumetric gas flow rate divided by the total cross-sectional area of the openings in the lower electrode 14. It is preferred that the linear velocity, measured relative to 1.0 atmosphere pressure and 100° C., be between 1.0 and 500.0 meters per second, and more preferably between 10.0 and 50.0 meters per second.

FIGS. 2a-2h illustrate typical designs for the lower electrode 14 for use in processing disc-shaped substrates. For example, in FIG. 2d, two slits of variable width provide a cross pattern for the plasma gas to exit from the device and impinge on the substrate 24. Other configurations of slits that may be employed include three or more disposed in radial fashion, or parallel to each other to create a ribbed design. In FIGS. 2e through 2h, the plasma flows through a series of holes that are arranged in different radial patterns. The object of all these designs is to give the desired flow velocity, while at the same time yielding uniform contacting with the substrate 24. The uniformity may be further enhanced by rapidly spinning the pedestal 22.

Although shown as circular in nature, electrodes 14 and 16 can be of any shape, e.g., round, elliptical, square, rectangular, hexagonal, etc. Electrodes 14 and 16 can also be of non-uniform or freeform shapes if desired. Further, although shown as flat plates, electrodes 14 and 16 can be curved or otherwise non-linear across the electrode such that the electrodes 14 and 16 are concave, convex, pointed, conical, peaked, or other shapes, or combinations of concave, convex, pointed, jagged, peaked, conical, substantially flat areas, or other shapes to describe any external perimeter shape and any topographical surface. Further, electrodes 14 and 16 can have different shapes, e.g., electrode 14 can be substantially circular, while electrode 16 is elliptical.

The holes and/or slits in the electrodes 14 and 16 can be of any shape, e.g., the holes and/or slits can be square, oblong, or some other freeform shape without departing from the scope of the present invention.

The electrodes 14 and 16 maybe made of any conductive material, including, but not limited to, metals, metal alloys, aluminum, stainless steel, monel, and silicon. The selection of each electrode 14 and 16 material depends on several factors. It must help to stabilize the plasma, conduct heat and electricity effectively, and resist corrosion by the reactive gases in the plasma. In one preferred embodiment, the electrodes are made of steel. In another preferred embodiment, the steel electrodes are coated with a layer of dielectric material, such as a film of silicate glass or aluminum oxide 1.0 micron in thickness. Further, electrodes 14 and 16 can have a metal or conductive material completely embedded into a dielectric material. The dielectric coating allows the plasma flow device to be operated at 760 Torr with as much as 45% higher applied RF power than is achievable in the absence of a coating. Each electrode 14 and 16 can also be made of different materials, or have different coatings, e.g., electrode 14 can be made of steel while electrode 16 is made of iron coated with a dielectric material.

Plasma-Enhanced Chemical Vapor Deposition

Another preferred embodiment of the present invention is as a device for the plasma-enhanced chemical vapor deposition (PECVD) of thin films. A thin film is deposited by combining a precursor to the film, such as tetraethoxysilane ($Si(OC_2H_5)_4$), with reactive gases generated in the plasma, such as oxygen atoms, causing them to react and deposit the desired materials, e.g., silicate glass ($SiO_2$). The chemical precursor can be fed with the other gases through tube 32, as shown in FIG. 1. This configuration may potentially lead to precursor decomposition and chemical vapor deposition between the upper and lower electrodes 16 and 14. Consequently, a preferred embodiment of the device for chemical vapor deposition is to add the precursor (e.g., tetraethoxysilane) in through a specially designed lower electrode. In this way, the plasma effluent and the precursor mix and react downstream as they flow toward the substrate, leading to substantially uniform deposition of substantially all the film over a large area of the substrate, instead of elsewhere in the device.

Figure 3:
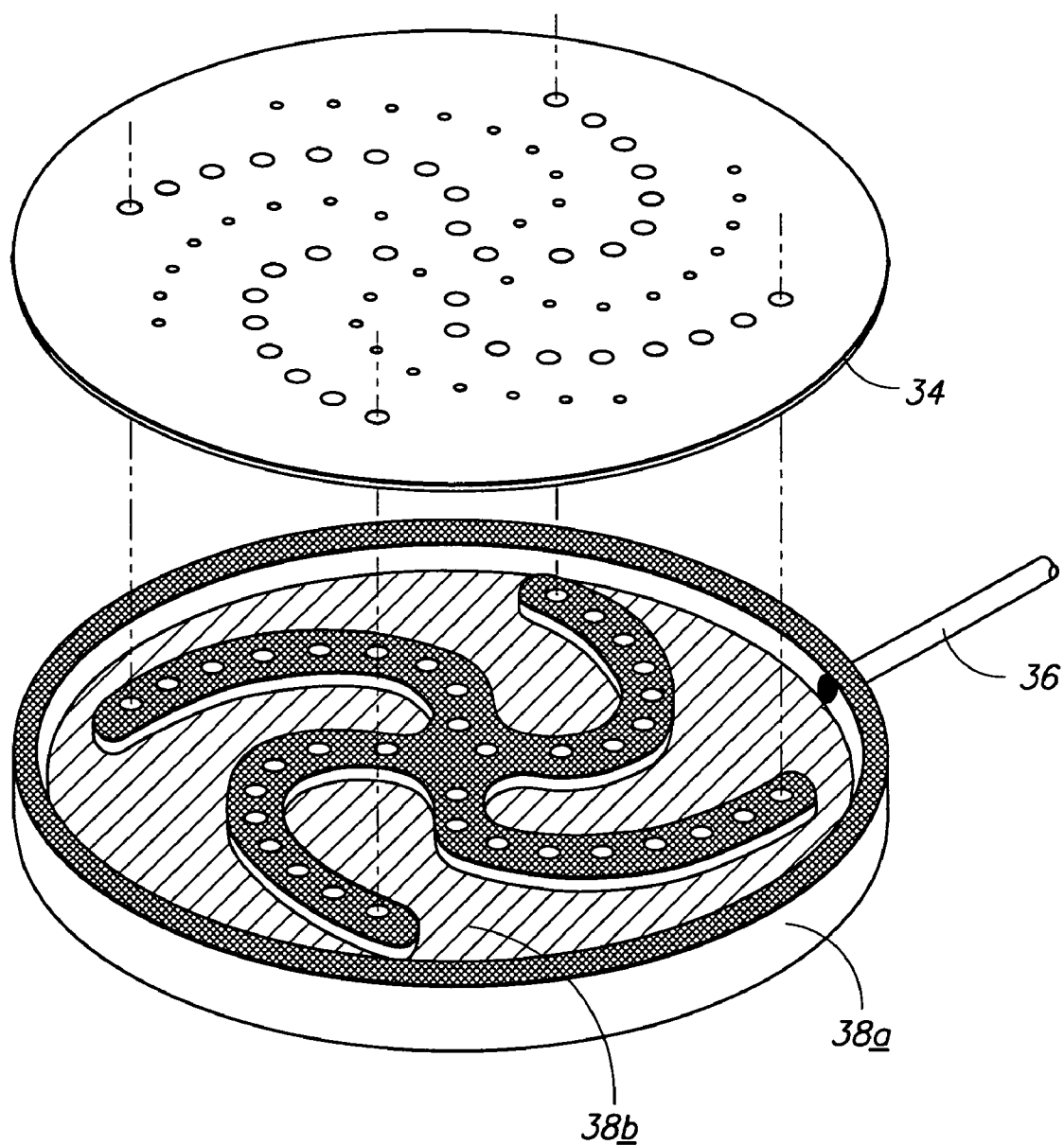
FIG. 3 illustrates a lower electrode configured for the addition of a precursor downstream of the plasma generated by the present invention.

A design for the lower electrode 14, modified for addition of a precursor, is illustrated in FIG. 3. This electrode is composed of a main body 38a, a cover 34 and an inlet tube 36. The cover 34 is welded onto the body 38a, creating a cavity 38b. During operation, the cover 34 faces the substrate 24. A chemical precursor is fed through tube 36, into cavity 38b, and out through the smaller array of perforations in the cover 34. The plasma flows through the body 38a and out the cover 34 through a separate array of larger perforations. The separation of the precursor and plasma streams allows for improved control over the addition of each reagent and over the linear velocities of each gas as they emerge from the plasma flow device. As with the electrodes of FIGS. 2a-2h, electrodes 14 and 16 used for PECVD can assume any perimeter shape, e.g., circular, elliptical, square, rectangular, etc. and assume any topographical surface, e.g., concave, convex, pointed, jagged, peaked, conical, or other shapes.

Reactor for Processing Disc-Shaped Substrates

Figure 4:
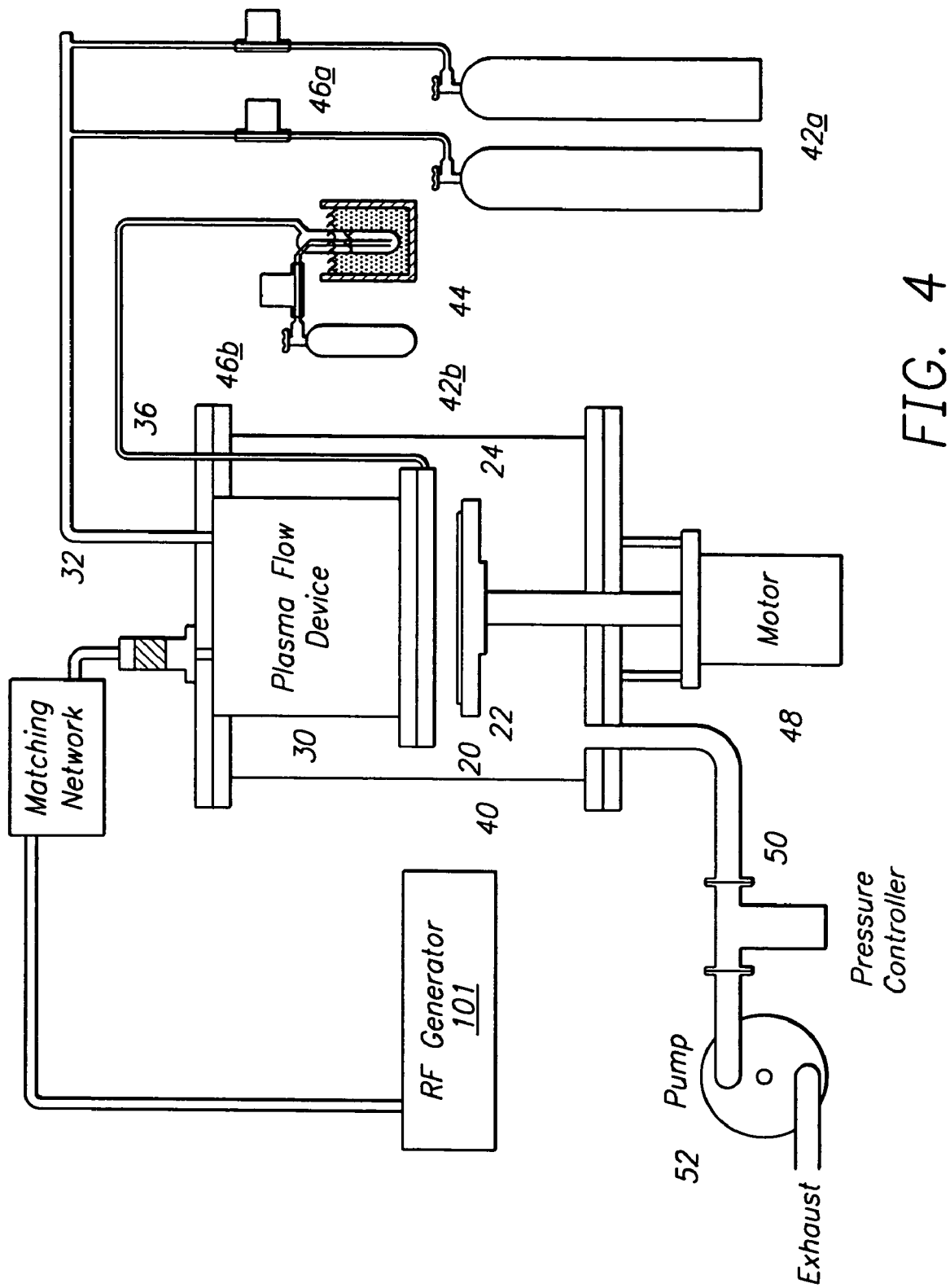
FIG. 4 is a schematic of a plasma reactor for cleaning, sterilization, surface activation, etching, or deposition of material on disc-shaped substrates in accordance with the present invention.

A preferred embodiment of the invention is to incorporate the plasma flow device shown in FIG. 1 into a process chamber with all the components needed for cleaning, sterilization, surface activation, etching or deposition of thin films onto substrates, or for any other desired materials processing application. A schematic of the entire reactor system is shown in FIG. 4. The process gas flows out of cylinders 42a, then through mass flow controllers 46a, and into the housing 30 through tube 32. The gas is ionized inside the plasma flow device, and it emerges at the bottom to impinge on the substrate 24. In addition, gas may flow out of a cylinder 42b, through a mass flow controller 46b, and into a bubbler 44 containing a volatile chemical precursor. The bubbler is held in a temperature-controlled bath to give a known vapor pressure of the precursor. The gas then becomes saturated with the precursor at the known vapor pressure, is carried into the reactor through tube 36, and emerges into the plasma stream through the lower electrode 14, using the design illustrated in FIG. 3. The plasma reactor is not limited by the precursor and gas supply shown in FIG. 4. Any number of precursors and gases may be used by adding more cylinders 42a and 42b, mass flow controllers 46a and 46b, and bubblers 44. Furthermore, the gases and precursors can be introduced in any combination to the reactor feed lines 32 and 36, depending on the application.

An RF generator 101 and matching network supply the power to the conducting electrodes needed to strike and maintain the plasma. The pedestal 22 may be rotated at any speed, but is typically rotated at 200 to 3000 rpm to enhance the uniformity of gas contact with the substrate. The housing 30, substrate 24 and pedestal 22 are sealed inside a reaction chamber 40, which is equipped with a means for mechanically loading and unloading substrates. After the reactive gas flows over the substrate 24, it exits out through the exhaust line 48. A pressure controller 50 and a pump 52 are used to control the pressure inside the reaction chamber 40 to any desired value between 10.0 and 1000.0 Torr. In another embodiment, multiple reaction chambers may be interfaced to a robotic platform for handling large numbers of substrates, as is normally done in process equipment for the semiconductor industry.

Rectangular Plasma Flow Device

Figure 5A:
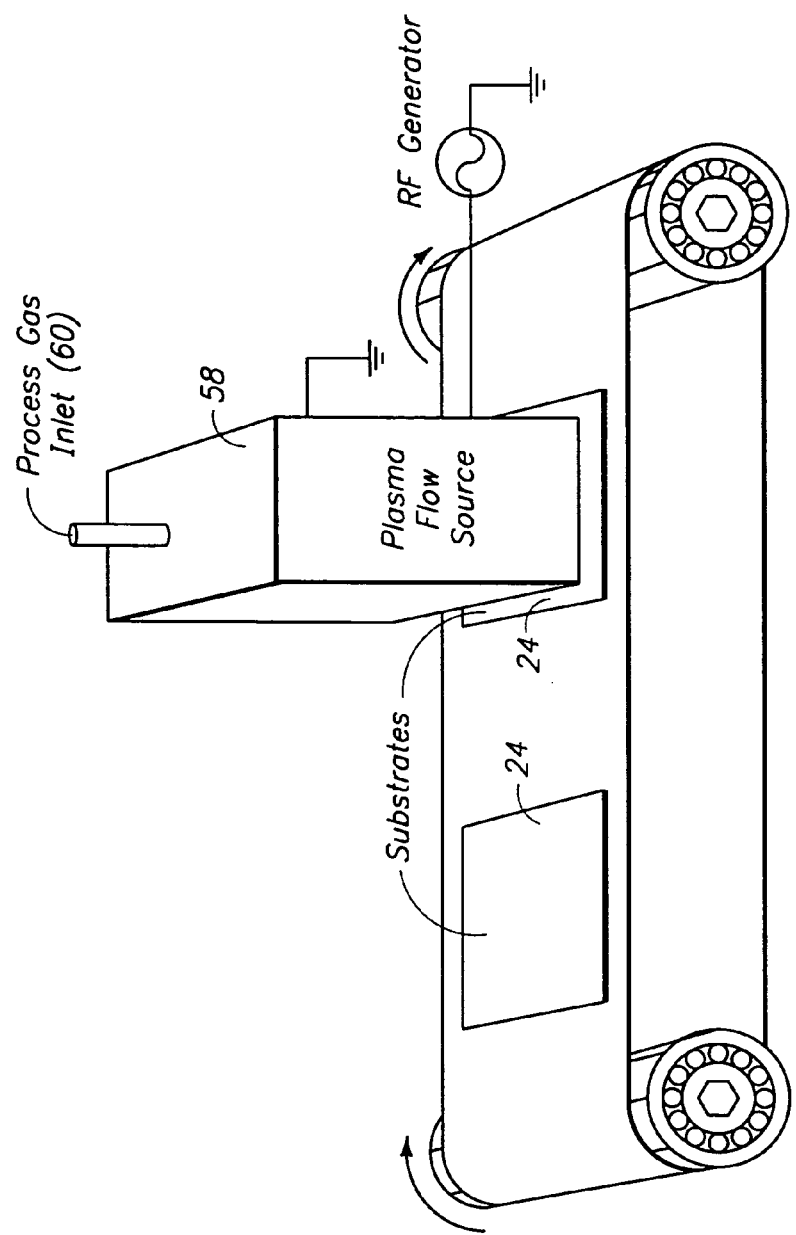
FIG. 5a is a schematic of a plasma flow device for continuous processing of substrates in accordance with the present invention.

The invention described herein can be applied to a variety of configurations for specific applications. Shown in FIG. 5a is a rectangular plasma flow device with plasma flow source 58 of the present invention that can be used for continuous processing of square substrates 24. The substrate 24 may also be circular, triangular, etc., or a continuous film or sheet that is rolled past the plasma source during processing. Two typical electrode configurations for this device are shown in FIGS. 5b and 5c.

Figure 5B:
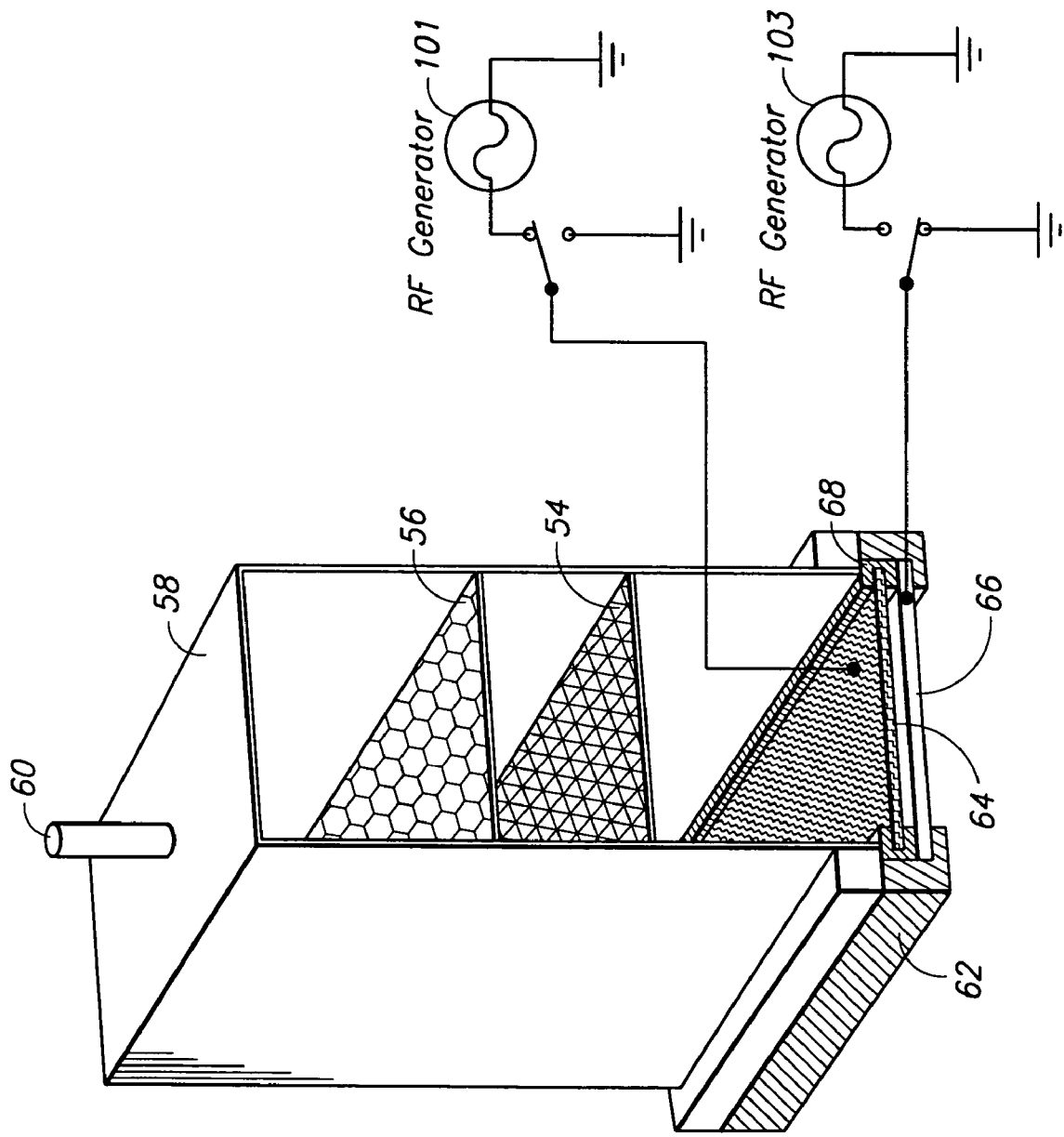
FIGS. 5b and 5c illustrate cross-sectional views of the device with two types of electrodes in accordance with the present invention.
Figure 5C:
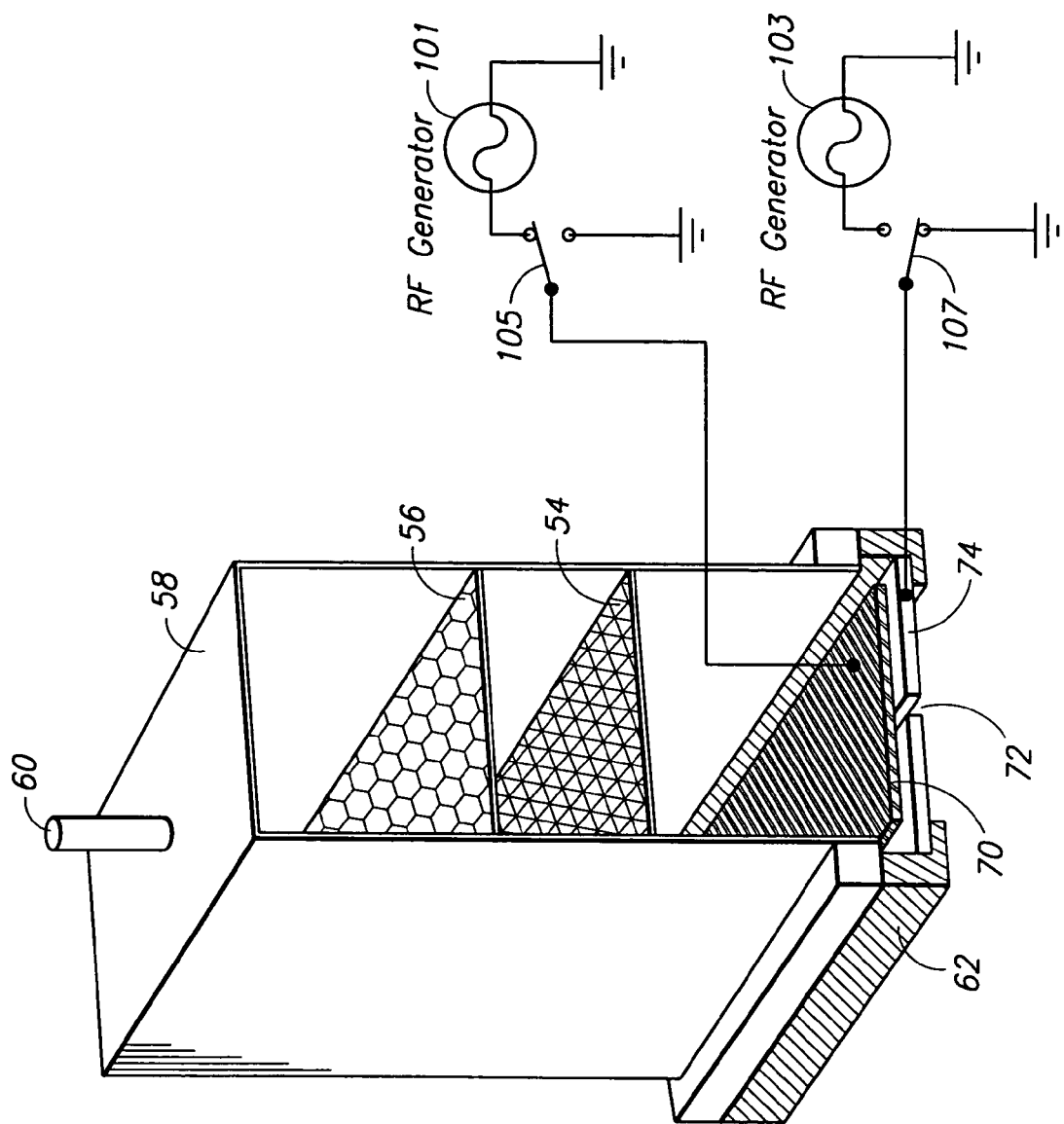

In FIGS. 5b and 5c, the process gas enters through a tube 60 attached to a rectangular housing 58. Two perforated sheets 56 and 54 make the gas flow in a uniform manner down the housing 58. The electrode configuration of the device shown in FIG. 5a is similar to that shown in FIG. 1. The upper electrode 64, dielectric spacer 68, and lower electrode 66 are held in place by a rectangular clamp 62. The dielectric spacer 68 electrically isolates the upper electrode 64 and creates a precision gap between the upper and lower electrodes 64 and 66. As with the electrodes in FIG. 1, it is preferred that the upper electrode be finely perforated to enhance the stability of the plasma, and that the lower electrode has fewer perforations to increase the liner velocity of the plasma effluent as discussed with respect to FIG. 2. The plasma is generated by applying RF power to one of the electrodes 64 using RF generator 101 and grounding the other electrode 66. FIG. 5c illustrates another embodiment in which the gas flows around the left and right edges of an upper electrode 70, then down through a slit 72 in the center of a lower electrode 74. A plasma is struck and maintained between these electrodes by applying RF power using RF generator 101 to one of the electrodes 14 or 16, using the switches 105 and 107. For example, electrode 70 is powered and electrode 74 is grounded in FIG. 5c, but by switching switches 105 and 107, electrode 74 can be powered by RF generator 103 and electrode 70 can be grounded. RF generators 101 and 103 can be the same RF generator if proper switching between plasma flow source 58 and RF generator 101 is performed.

Central Cavity Electrode with Inward Plasma Flow

Figure 6A:
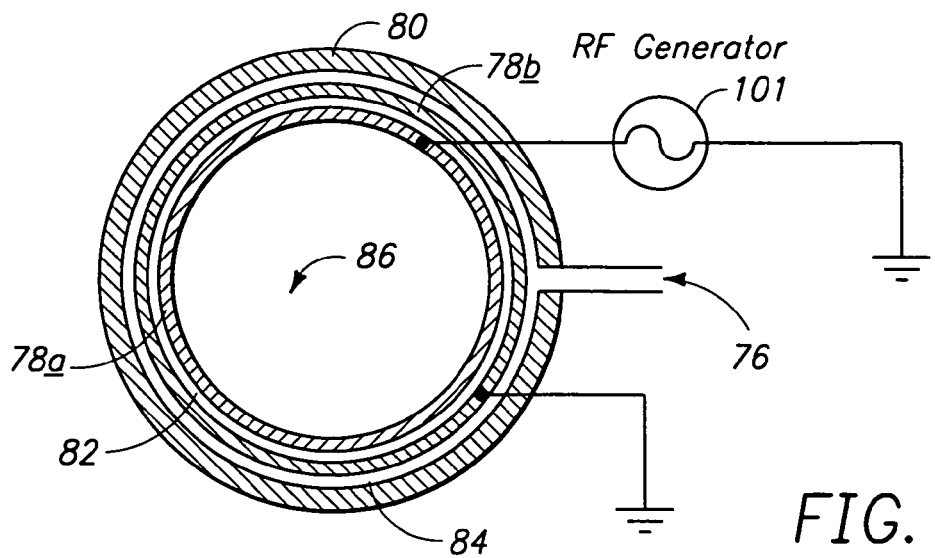
FIGS. 6a and 6b illustrate axial and longitudinal cross-sections of a plasma flow device in accordance with the present invention where the reactive gas flows inward.
Figure 6B:
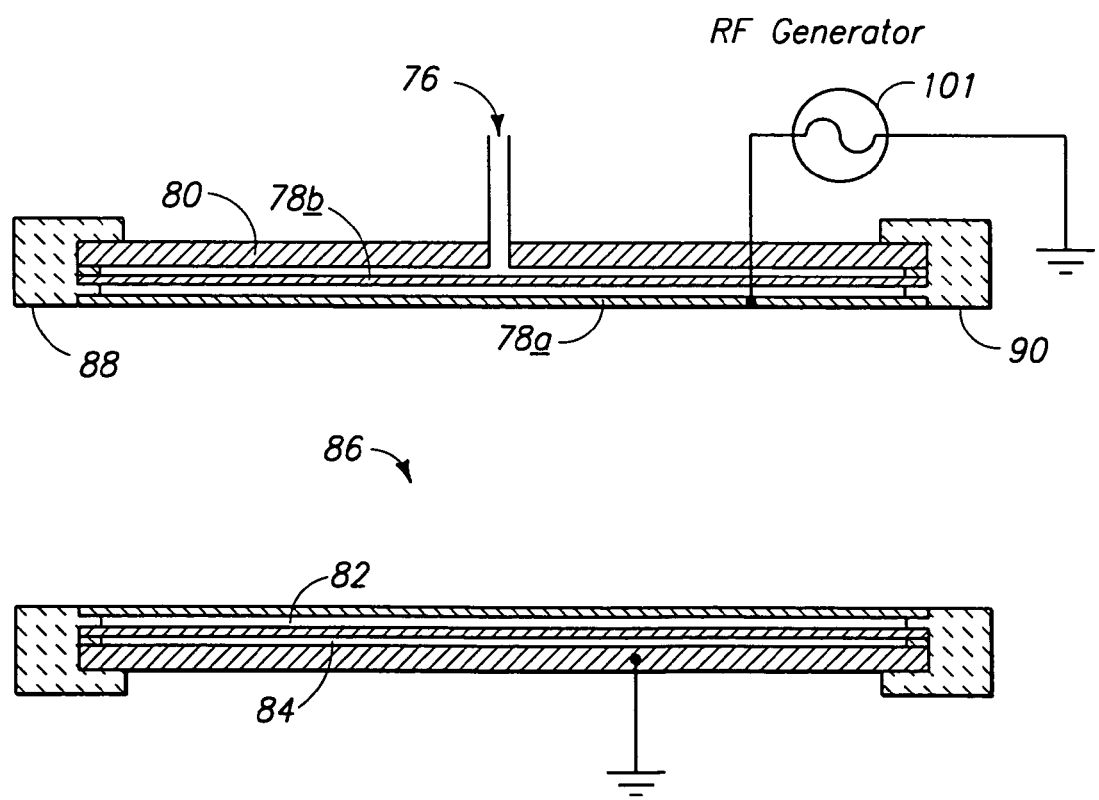

In an additional embodiment, the device is constructed to direct the plasma effluent toward a central cavity as shown in FIGS. 6a and 6b. The process gas enters the device through a tube 76 and flows into a hollow cavity 84. The hollow cavity 84 distributes the process gas within an outer conductive electrode 78b. The outer electrode 78b has openings to allow the process gas to flow into a gap 82 between it and an inner conductive electrode 78a. Dielectric end caps 88 and 90, shown in FIG. 6b, contain the gas within the gap 82 and hold together the outer and inner electrodes 78a and 78b. In the embodiment shown in FIGS. 6a and 6b, RF power is applied to the inner electrode 78a, while the outer electrode 78b is grounded, causing a plasma to be stuck and maintained in the gap 82. Alternatively, the RF power may be applied to the outer electrode 78b, while the inner electrode 78a remains grounded.

The choice of which electrode 78a or 78b to ground depends on the particular application of the plasma flow device, as described above. The preferred spacing of the electrodes 78a and 78b is similar to that described for the plasma flow device in FIG. 1. In addition, the electrodes 78a and 78b are designed to allow gas to flow through them in the same way as shown for the disc-shaped electrodes in FIG. 2. The plasma or plasma effluent passes out into a processing region 86 where a substrate or work piece is located. The substrate or work piece can be any object that fits inside the processing region 86, such as a wire, cord, pipe, machined part, etc., and it can be rotated within or translated through the processing region 86. The plasma impinging on the substrate or work piece causes the substrate or work piece to be cleaned, sterilized, surface activated, etched, or deposited thereupon.

Central Cavity Electrode with Outward Plasma Flow

Figure 7A:
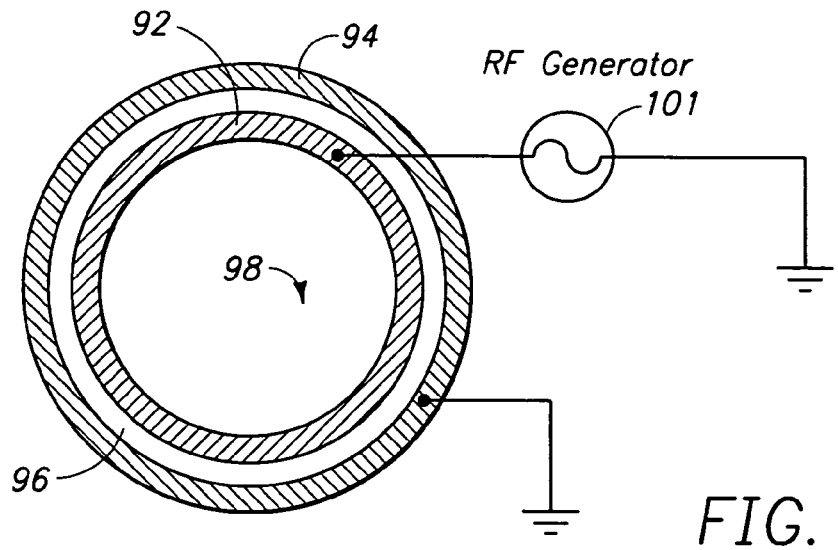
FIGS. 7a and 7b show axial and longitudinal cross-sections of a plasma flow device in accordance with the present invention where the reactive gas flows outward.
Figure 7B:
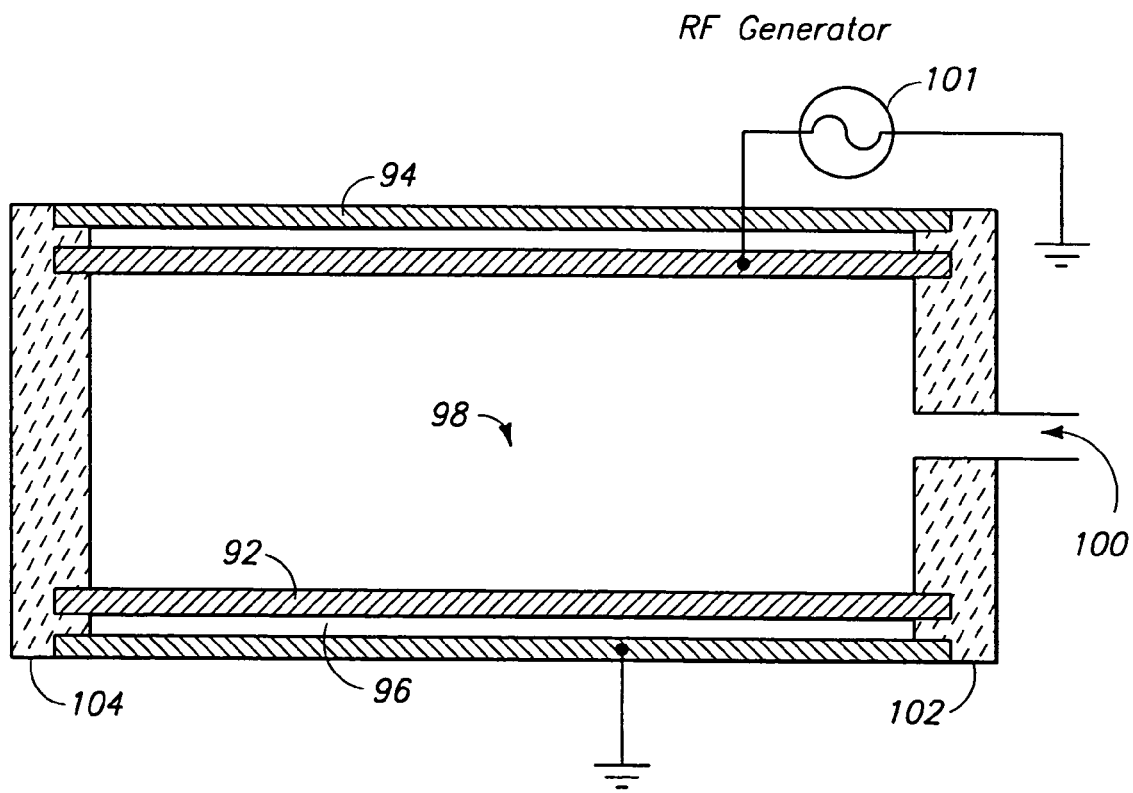

In an additional embodiment, the invention is configured in a way that directs the reactive gas flow radially outward as shown in FIGS. 7a and 7b. The process gas enters the device through a tube 100 attached to a dielectric end cap 102, and fills a cavity 98. Then the gas flows through an inner conductive electrode 92 into a gap 96 and out through an outer conductive electrode 94. A perforated sheet may be inserted in the cavity 98 to enhance the uniformity of gas flow through the inner electrode 92. The electrode spacing and openings are analogous to those described in the preferred embodiments in FIGS. 1 and 2. The dielectric end caps 102 and 104 contain the gas and hold in place the inner and outer electrodes 92 and 94. Applying RF power from the signal generator 101 to the inner electrode 92, and grounding the outer electrode 94, or, alternatively, applying RF power from the signal generator 101 to the outer electrode 94 and grounding the inner electrode 92, generates a plasma within the gap 96. The reactive gas produced therefrom exits through the openings in the outer electrode 94 and impinges on a substrate or work piece that surrounds the device. In this configuration, the substrate or work piece may be the interior of a pipe, duct, tank, etc., and the plasma flow device may clean, sterilize, surface activate, etch, or deposit thin films onto it, thereby imparting to the substrate or work piece a desirable property.

Parallel Electrodes

Figure 8:
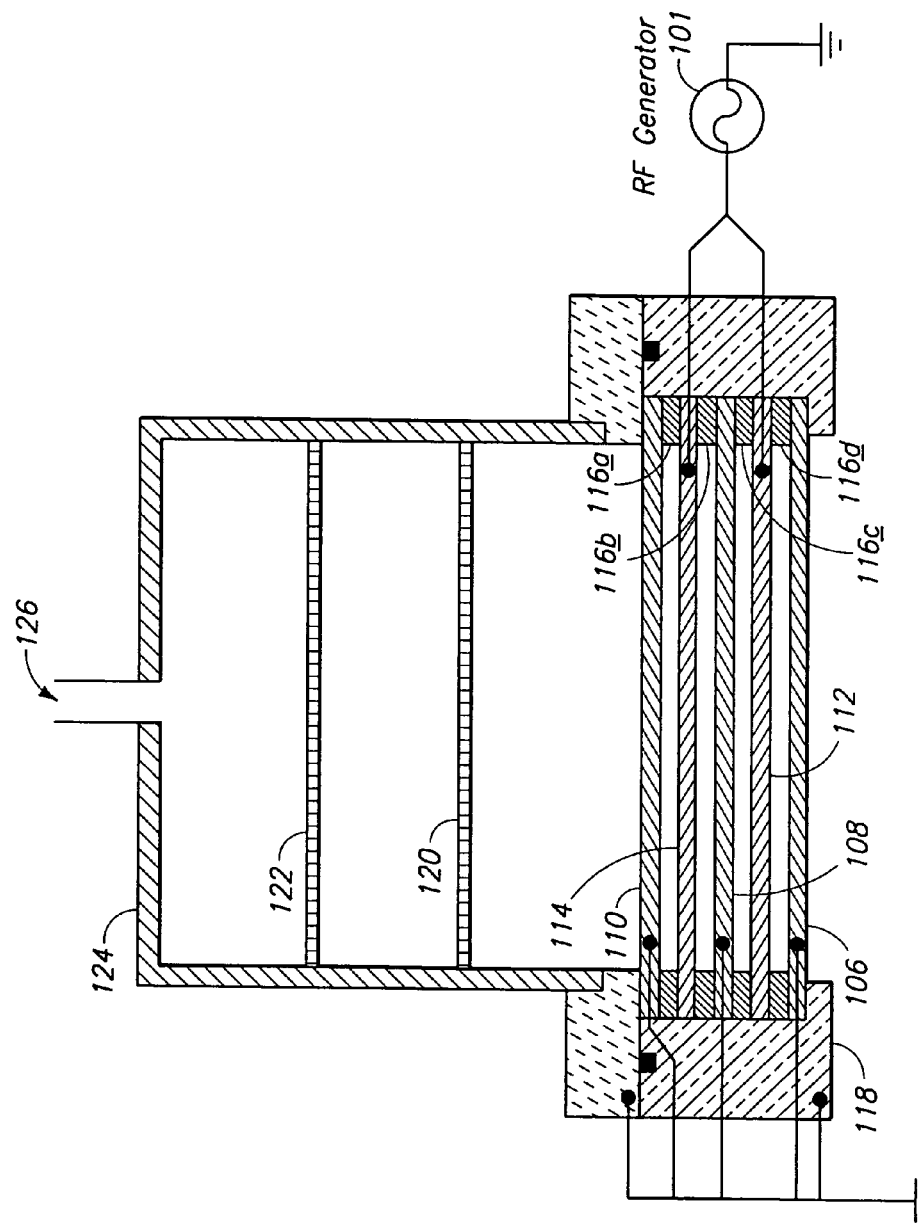
FIG. 8 is a cross-sectional view of a plasma flow device in accordance with the present invention containing an array of alternating powered and grounded electrodes.

The invention is also embodied in a plasma flow device with an array of parallel electrodes as shown in FIG. 8. The advantage of this configuration is a longer residence time of the gas within the plasma generation zone, which increases the concentration of reactive species for cleaning, sterilization, surface activation, etching, and deposition processes. The stacking sequence alternates between grounded and powered electrodes. The design presented in the figure is one example of an electrode array. Other designs are possible. In addition, the plasma flow device may be operated with more or less electrodes than those shown. The gas enters a housing 124 through a tube 126, passes through two perforated sheets 122 and 120, and on through electrodes 110, 114, 108, 112 and 106. The electrodes are held in place and electrically isolated from one another by four dielectric spacers 116a-116d. The entire assembly, including the electrodes 110, 114, 108, 112 and 106, and the dielectric spacers 116a-116d, are mounted onto the housing 124 with a clamp ring 118. In the embodiment shown in FIG. 8, RF power is applied to electrodes 114 and 112, whereas electrodes 110, 108 and 106 are grounded, which results in the generation of a plasma in the four gaps between them. The plasma or plasma effluent exits from electrode 106 and impinges onto a substrate mounted directly below it as illustrated in FIG. 1.

The electrode spacing depends on the electrode 106-114 design, operating pressure and gas composition, and is typically between 0.1 and 20.0 mm. For operation near atmospheric pressure (about 760 Torr), a gap between 0.5 and 3.0 mm is preferred. For lower pressure operation, wider gaps are preferred. The openings in the electrodes may be of the same design as those shown in FIG. 2. It is preferred that electrodes 110, 114, 108 and 112 contain fine perforations, with hole diameters between 0.01 and 0.10 inches in diameter, as given in FIGS. 2a-2c. Conversely, the bottom electrode 106 should preferably incorporate a design similar to that illustrated in FIGS. 2a-2h. Another embodiment of the bottom electrode 106 is shown in FIG. 3, whereby a precursor may be separately injected into this electrode, causing it to mix with the plasma effluent downstream of the device. This latter configuration is desirable for operating the plasma flow device as a chemical vapor deposition reactor.

Operation of the Plasma Flow Device

The invention, in another aspect, is embodied by certain methods of using the plasma flow device illustrated in FIGS. 1-8. A gas mixture is made to flow through the device and is converted into a plasma between the powered and grounded electrodes. This gas emerges from the device and impinges on a substrate where a desired cleaning, sterilization, surface activation, etching, deposition, or other materials process takes place. The invention may be operated with a variety of different gases at pressures ranging from 10.0 to 5000.0 Torr. The temperature of the gas exiting the device generally ranges from 50 to 250° C., although other temperatures may be attained depending on the particular embodiment of the invention. The temperature of the substrate 24 is important for the desired process, and this can be independently adjusted by providing heating or cooling through the pedestal 22 that holds the substrate, or by other means. As described earlier, the linear velocity of the gas through the last electrode prior to exiting the device, e.g., outer electrode 14 should be relatively high so that the reactive species impinge on the substrate before being consumed by gas-phase reactions. It is preferred that the linear velocity, measured relative to 1.0 atmosphere pressure and 100° C., be between 1.0 and 500.0 meters per second, and more preferably between 10.0 and 50.0 meters per second.

There are many advantages to being able to operate the invention at any pressure between 10.0 and 1000.0 Torr. For example, at atmospheric pressure, the device can be used without a chamber, pump or pressure-control system, which results in substantial cost savings. In addition, the plasma flow device can treat any object regardless of its size, such as for example, the window glass on a high-rise building, or the hull of a ship.

A wide variety of gases may be passed through the plasma flow device, depending on the desired application, such as helium, argon, oxygen, nitrogen, hydrogen, chlorine, and carbon tetrafluoride, and other gases. The gas composition affects the stability and operation of the device, and must be accounted for in the design. At pressures above 100.0 Torr, helium is sometimes added to help stabilize the plasma. The amount of helium usually exceeds 50% by volume. Nevertheless, the helium concentration required depends on the other components in the gas and can be as little as 10% by volume when air is the second component. For operation at pressures below about 100 Torr, there is typically no advantage to adding helium to the gas stream, and any combination of gases may be selected for a given application.

The present invention allows the plasma or plasma effluent to be generated over a larger area than devices of the prior art. Typical uses for such plasmas include e.g., cleaning, stripping, deposition of materials, etching, activation of surfaces, etc. Such uses require a plasma to cover a large surface area, e.g., greater than 1 cm$^2$. The prior art can only generate plasma beams over small areas, which requires a substrate or other work piece to be translated underneath the plasma beam to ensure contacting the entire surface of the substrate with the plasma. The present invention suffers from no such limitation, and can produce a plasma with a substantially uniform flux of a reactive specie over a large area, e.g., an area larger than 1 cm$^2$.

Plasma Flow Device for Stripping and Cleaning

The plasma flow device of the present invention may be used to strip organic compounds and films from surfaces, thereby cleaning the substrate or work piece. To demonstrate this process, films of photoresist (AZ 5214 made by Hoechst Celanese) and pump oil (hydrocarbon of formula $C_{30}H_{62}$ made by Varian, type GP) were stripped from a silicon wafer. Both of these operations were carried out with a device similar to that shown in FIG. 1. The diameter of the electrodes used was 32 mm, and they were separated by a gap of 1.6 mm. The process gas, consisting of helium and oxygen was passed through two perforated parallel electrodes before impinging on the substrate. The plasma was maintained by the application of RF power to the upper electrode, while the lower electrode closest to the substrate was grounded. The only heat supplied to the substrate was from the plasma effluent, which was at a temperature near 100° C. for each case.

Figure 9:
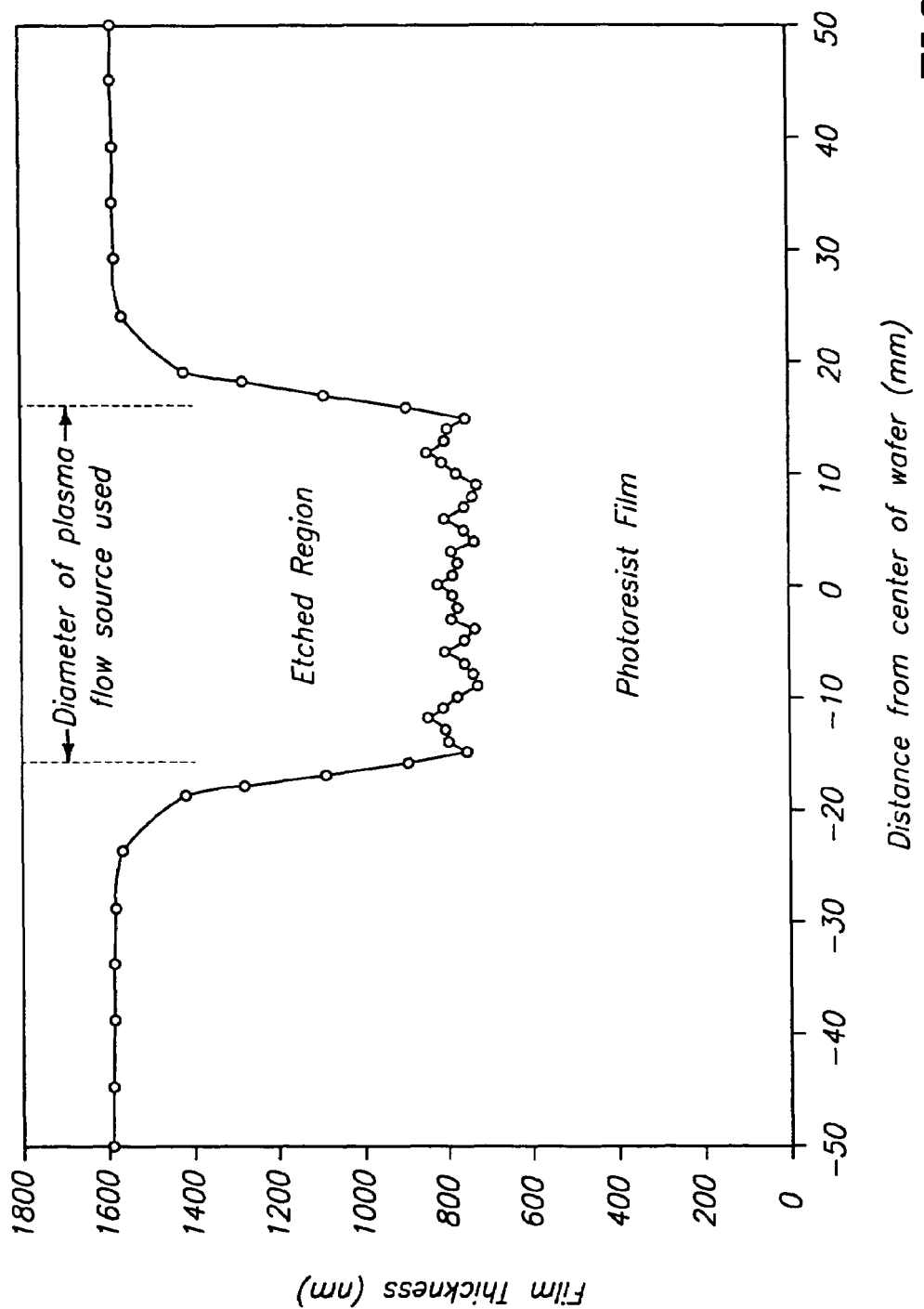
FIG. 9 illustrates a thickness profile for a photoresist film deposited on a 100-mm silicon wafer and etched with a cylindrical plasma flow device having an electrode diameter of 32 mm in accordance with the present invention.

The photoresist was spun onto a 100-mm silicon wafer and heated in an oven for 30 minutes at 140° C. to harden the resist. The resulting organic layer was 1.6 microns thick. The conditions used to strip this material from the substrate were: 42.3 liters/minute (L/min) of helium; 0.85 L/min of oxygen; ~760 Torr total pressure; 115 Watts RF power at 13.56 megahertz; a substrate rotation speed of 2300 rpm; 3.0 mm distance between the lower electrode and the substrate; and a processing time of 2.0 minutes. After exposure to the plasma, the thickness profile of the photoresist film was obtained with a Nanospec thin-film measuring system. The results are shown in FIG. 9. A circular hole of about 30-mm in diameter was dug into the organic layer 800 nanometers (nm) deep, yielding a stripping rate of 0.4 microns/minute. A sharp change in depth is observed between the region exposed to the plasma, and the material outside this region. Within the stripped region, the remaining photoresist film was of uniform thickness, as is evident by inspection of FIG. 9. In other experiments, an etching rate of the photoresist of 1.5 μm/min was obtained using a stacked electrode design as shown in FIG. 8 with an RF power of 275 W. By increasing the diameter of the electrodes to 100 mm, the entire photoresist film was removed from the silicon wafer.

In the processing of silicon wafers and other substrates, it is possible that oil vapors from a mechanical pump or robotic arm may contaminate the substrate. To demonstrate the ability of the plasma flow device to clean away this contaminant, a large drop of mechanical-pump oil (Varian type GP) was spread upon a clean 100-mm silicon wafer. The oil film was clearly visible. The film was then removed with the plasma flow device at following conditions: 42.3 L/min helium; 0.69 L/min oxygen; 760 Torr total pressure; 105 Watts RF power, a substrate rotational speed of 1600 rpm; 5.0 mm distance between the lower electrode and the substrate; and a processing time of 2.0 minutes. By visual inspection, the oil film was completely absent after processing.

Plasma Flow Device Used for Sterilization

The plasma flow device of the present invention is well suited for sterilizing a wide variety of products used by the medical, pharmaceutical and food industries. The reactive oxygen species produced in the oxygen plasma described in the preceding example are considered to be preferred agents for attacking and killing biological agents. The design of the plasma flow device may vary depending on the size and shape of the substrate or work piece, and the need to provide good contacting to its surfaces.

The operation of the device would be basically the same as that used for the stripping and cleaning operations. An example of a work piece would be a basket containing a selection of surgical tools that need to be sterilized prior to performing an operation. The basket would be placed inside a chamber that houses the plasma flow device. Agitation could be supplied during operation so that the tools would constantly shift their positions and expose all their surfaces to the flowing plasma effluent. To enhance contacting of the plasma with the instruments, the pressure in the device could be lowered to 10 Torr if desired. Alternatively, higher flow velocities might be used. This application has many advantages over current methods of sterilization, which use toxic gases or solvents, are not completely effective, and pose significant safety and health risks to the workers who use them.

Plasma Flow Device Used for Etching

The plasma flow device of the present invention is well suited for etching materials, such as glass or metal. Although a variety of gases can be used for this purpose, such as chlorine, nitrogen trifluoride, carbon trifluorochloride, boron trichloride, bromine, etc, carbon tetrafluoride was used in these experiments. This application of the plasma flow device was demonstrated by etching a thermally grown silicon dioxide film and a tantalum film, using a design analogous to that shown in FIG. 1. The diameter of electrodes was 32 mm and the gap between them was 1.6 nm. The plasma was maintained by the applying RF power to the upper electrode and grounding the lower electrode. For each case, the substrate temperature was near 150° C., which was the approximate gas temperature in the effluent of the device.

Figure 10:
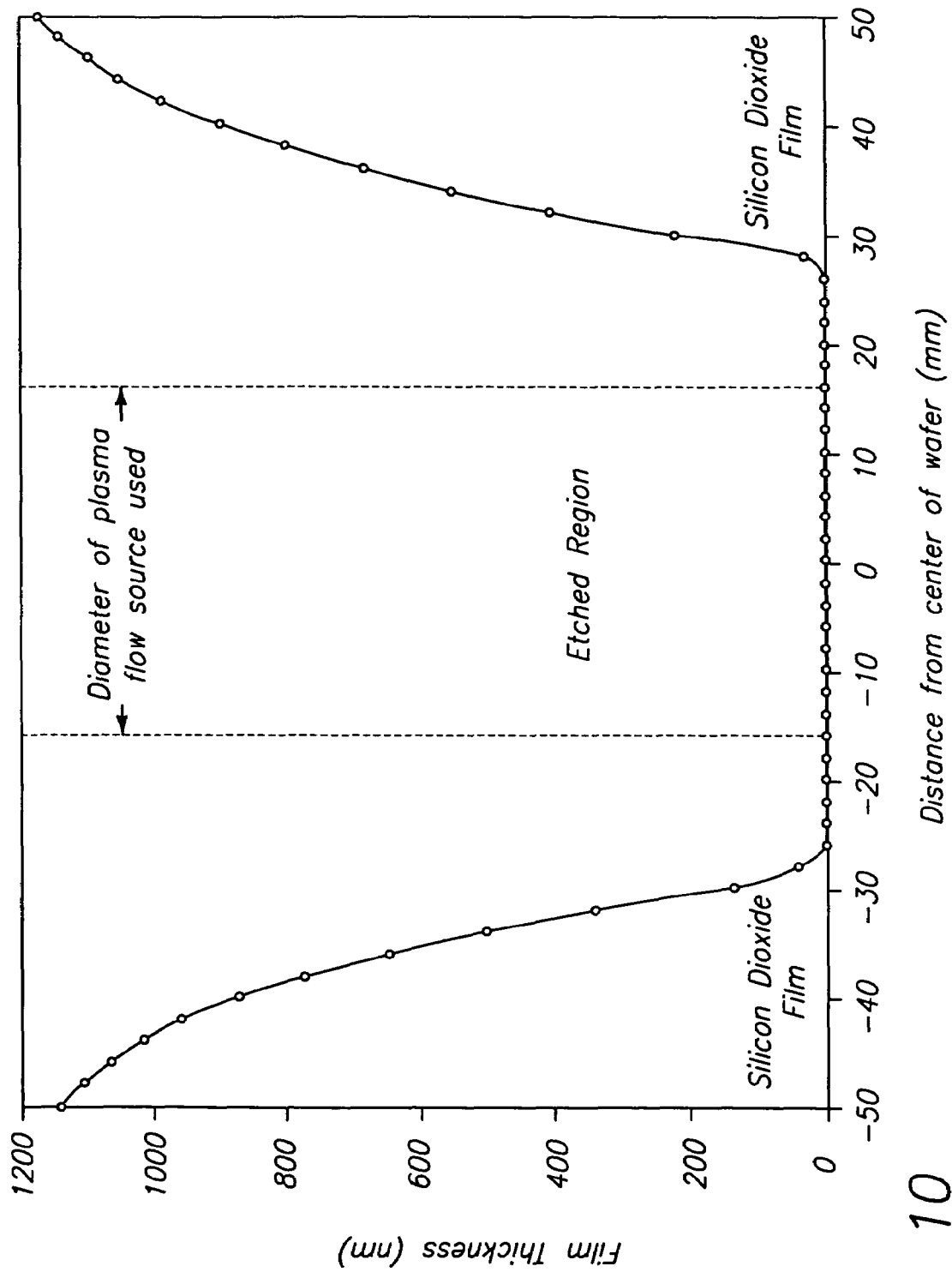
FIG. 10 illustrates a thickness profile for a silicate glass film grown on a 100-mm silicon wafer and etched with a cylindrical plasma flow device having an electrode diameter of 32 mm in accordance with the present invention.

A layer of silicate glass was grown on a 100-mm silicon wafer by heating it in a furnace to 1000° C. in the presence of oxygen and water. The resulting thickness of the $SiO_2$ layer was 1.3 microns. The conditions used to etch this film were: 42.3 L/min helium; 0.65 L/min oxygen; 1.8 L/min carbon tetrafluoride; ~760 Torr total pressure; 500 Watts RF power, a substrate rotational speed of 1600 rpm; 4.0 mm distance between the lower electrode and the substrate; and a processing time of 4.5 minutes. As evidence of the successful etching of the silicate glass film, a thickness profile of the remaining material is shown in FIG. 10. The thickness of the glass film drops rapidly to zero at a distance of 26 mm from the wafer center, an area significantly larger than that covered by the plasma flow device. Etch rates over 0.5 microns/min were obtained with this process.

A tantalum film was deposited on a 100-mm silicon wafer using an electron-beam evaporation process. The thickness of the tantalum layer was 1.3 microns. This metal film was etched under the following conditions: 42.3 L/min helium; 0.75 L/min oxygen; 1.8 L/min carbon tetrafluoride; ~760 Torr total pressure; 550 Watts RF power, a substrate rotational speed of 1600 rpm; 5.0 mm distance between the lower electrode and the substrate; and a processing time of 1.0 minute. The film located underneath the plasma source was etched in less than 1 minute, yielding an etch rate of at least 1.3 microns/min. The process as shown in this example is not optimized for tantalum etching, and through using different gases and process conditions, it should be possible to obtain significantly higher removal rates. By increasing the diameter of the electrodes to 100 mm, the entire tantalum film was removed from the silicon wafer.

Practically any inorganic material can be etched with the plasma flow device using halogen-containing feed gases, in other words, molecules with chlorine, fluorine, or bromine atoms in them. The only requirement is that the product of the reaction of the plasma with the inorganic material is a volatile metal halide (e.g., $MF_x$, $MCl_y$ or $MBr_z$), where M is derived from one or more components of the material. The inorganic materials that may be etched with this device or reactor include, but are not limited to, metals, metal oxides, metal nitrides, metal carbides, silicate glass, silicon nitride, silicon carbide, silicon, gallium arsenide and other semiconductors.

Device for Chemical Vapor Deposition

In addition to cleaning, sterilization, surface activation, and etching applications, the plasma flow source of the present invention may be used to deposit thin films by plasma-enhanced chemical vapor deposition (PECVD).

In PECVD, a chemical precursor, containing one or more of the elements to be incorporated into the film to be grown on a substrate, is mixed into the plasma. The plasma reacts with the precursor leading to the growth of a thin film on the substrate. The CVD process was demonstrated by reacting tetraethoxysilane ($Si(OC_2H_5)_4$) with an oxygen plasma, resulting in the deposition of a silicate glass film. A device analogous to that shown in FIG. 1 was used with electrodes 32 mm in diameter and separated by a gap of 1.6 mm, although other diameters and gaps can be used. The electrodes were coated with approximately 1 micron of silicon dioxide to increase the stability of the plasma source. The upper electrode was powered, while the lower one was grounded. The only heat supplied to the substrate was from the plasma effluent, which was at a temperature of about 105° C. The tetraethoxysilane (TEOS) was introduced either with the main process gas flow, or through the lower electrode as illustrated in FIG. 3.

Figure 11:
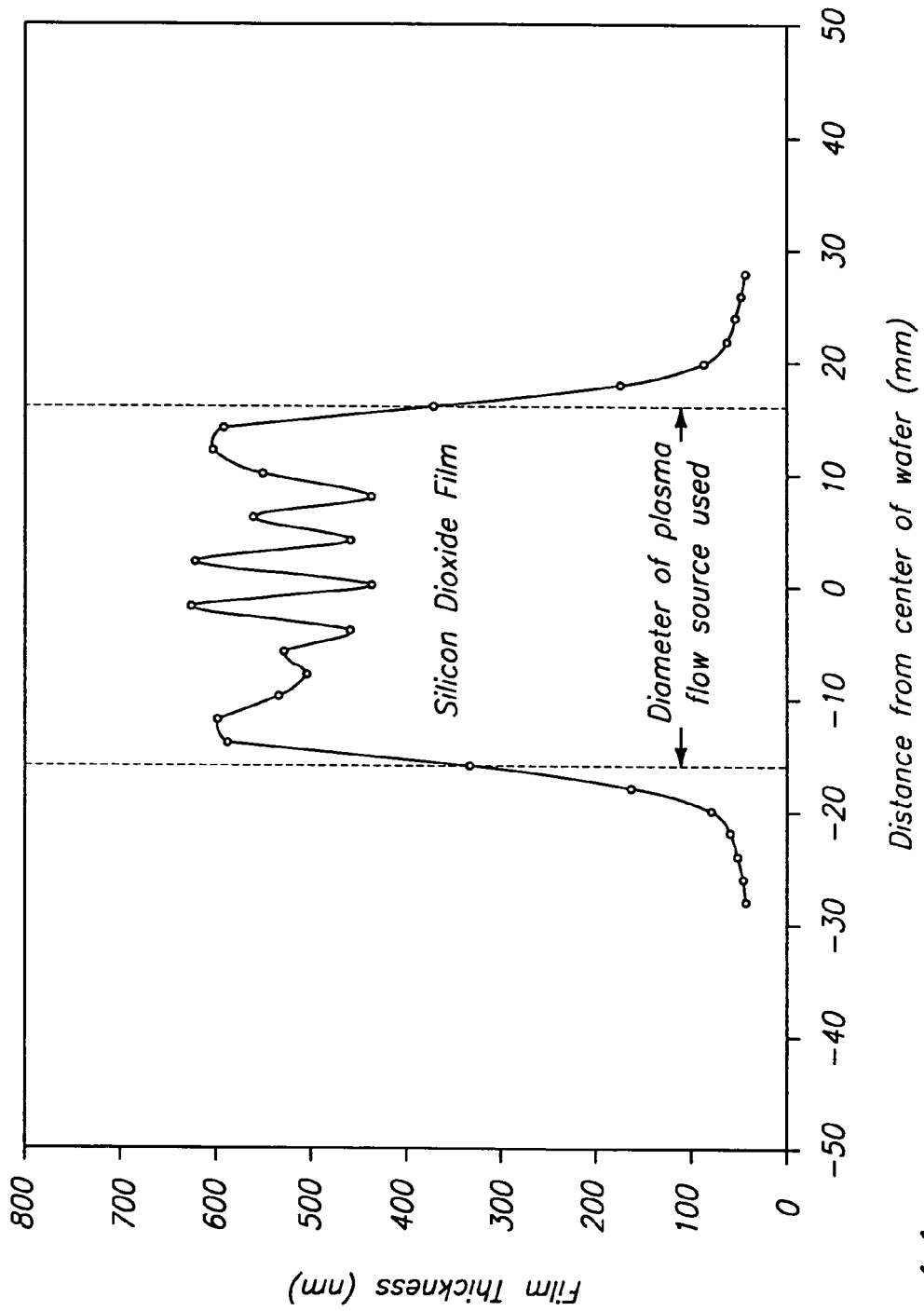
FIG. 11 illustrates a thickness profile for a silicate glass film deposited on a 100-mm silicon wafer using a cylindrical plasma flow device having an electrode diameter of 32 mm in accordance with the present invention.

In the case where the precursor is added in the gas inlet, e.g., tube 32 in FIG. 1, deposition occurs on the electrode surfaces as well as on the substrate. Although high deposition rates may be achieved with this method, this is generally an undesirable approach because it reduces the efficiency of the process, and eventually the plasma flow device will have to be cleaned of the deposits. Nevertheless, a glass film was deposited using this method under the following conditions: 42.0 L/min helium; 1.4 L/min oxygen; 17.7 milligrams/min TEOS; 760 Torr total pressure; 115 Watts RF power, a substrate rotational speed of 2400 rpm; 5.0 mm distance between the lower electrode and the substrate; and a processing time of 8.0 minutes. A thickness profile of the resultant film was obtained with a Nanospec system, and the results are shown in FIG. 11. The silicon dioxide film was deposited over an area approximately equal to that of the disc-shaped electrode (32 mm in diameter) at a rate of about 0.1 microns/min. It should be noted that the example presented here is not optimized. With further improvements in the design and operation of the plasma-enhanced CVD reactor, much higher deposition rates and much more uniform films can be achieved using the present invention. Furthermore, the plasma flow device can be easily scaled up to coat much larger substrate areas.

Figure 12:
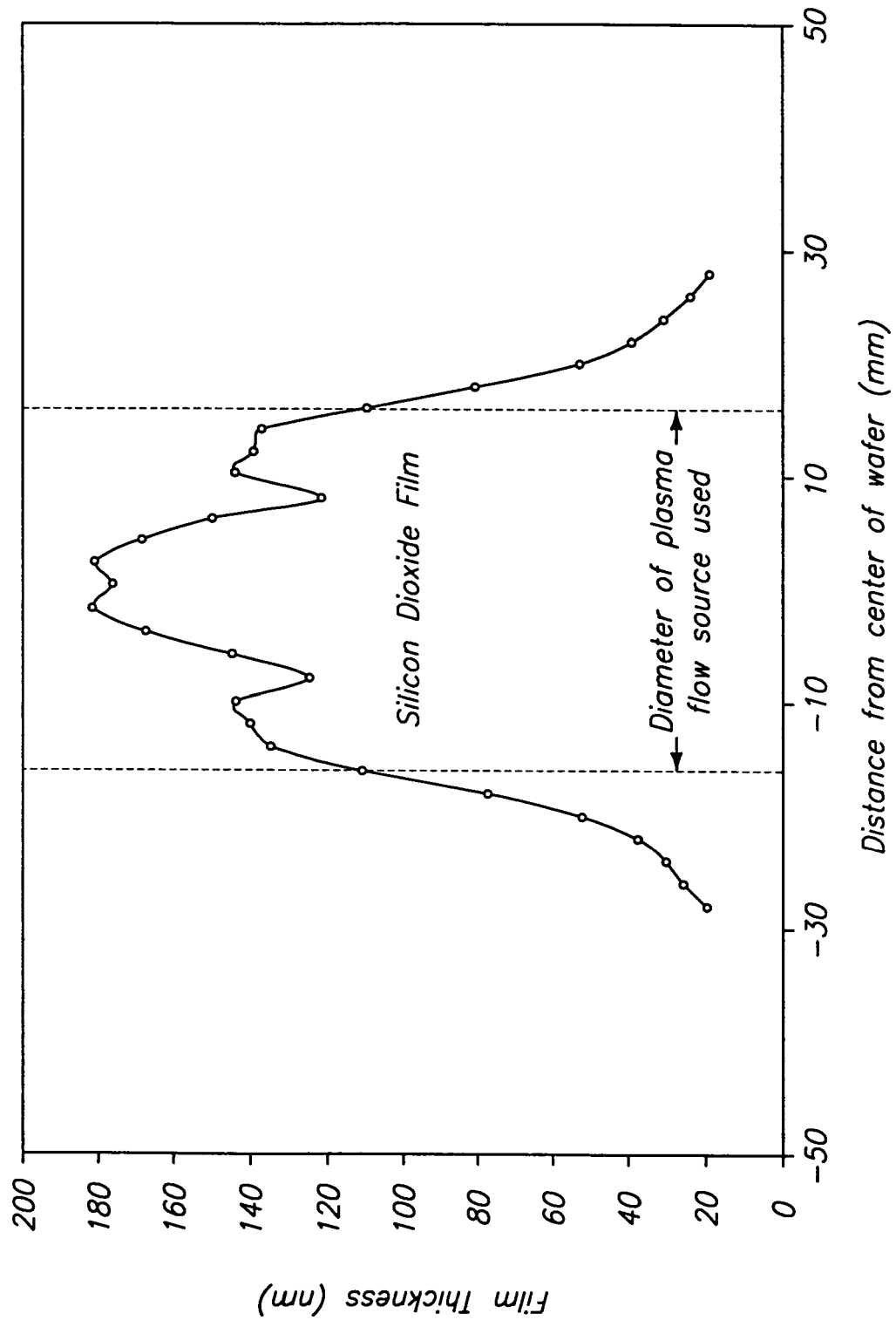
FIG. 12 illustrates a thickness profile for a silicate glass film deposited on a 100-mm silicon wafer using a cylindrical plasma flow device having an electrode diameter of 32 mm as embodied in FIG. 3.

In the case where the precursor is added to the plasma effluent through the gas inlet tube to the lower electrode (tube 36 in FIGS. 3 and 4), deposition occurs only on the substrate and not inside the plasma source. This is a preferred embodiment of the plasma-enhanced CVD reactor. To demonstrate this process, a glass film was deposited using the following conditions: 42.3 L/min helium; 0.85 L/min oxygen; 17.7 milligrams/min TEOS; 760 Torr total pressure; 150 Watts RF power, a substrate rotational speed of 2200 rpm; 15.0 mm distance between the lower electrode and the substrate; and a processing time of 4.0 minutes. A thickness profile of the resultant film is shown in FIG. 12. A disc-shaped silicate glass film was obtained over a diameter of about 32 cm (same size as lower electrode) at a rate of about 0.14 microns/minute. Much higher deposition rates and more uniform films covering larger substrate areas are easily obtained through further modifications of the plasma flow device design and operating conditions. This example simply serves to demonstrate the reduction to practice of the invention embodied herein.

The plasma flow device may be used to deposit practically any organic or inorganic thin film in the manner described above. The only requirement is that the elements required in the film can be fed to the reactor through a volatile chemical precursor as illustrated schematically in FIG. 4. Materials that may be deposited with this device or reactor include, but are not limited to, metals, metal oxides, metal nitrides, metal carbides, silicate glass, silicon nitride, silicon carbide, silicon, gallium arsenide, gallium nitride, and other semiconductors and materials.

Process Chart

Figure 13:
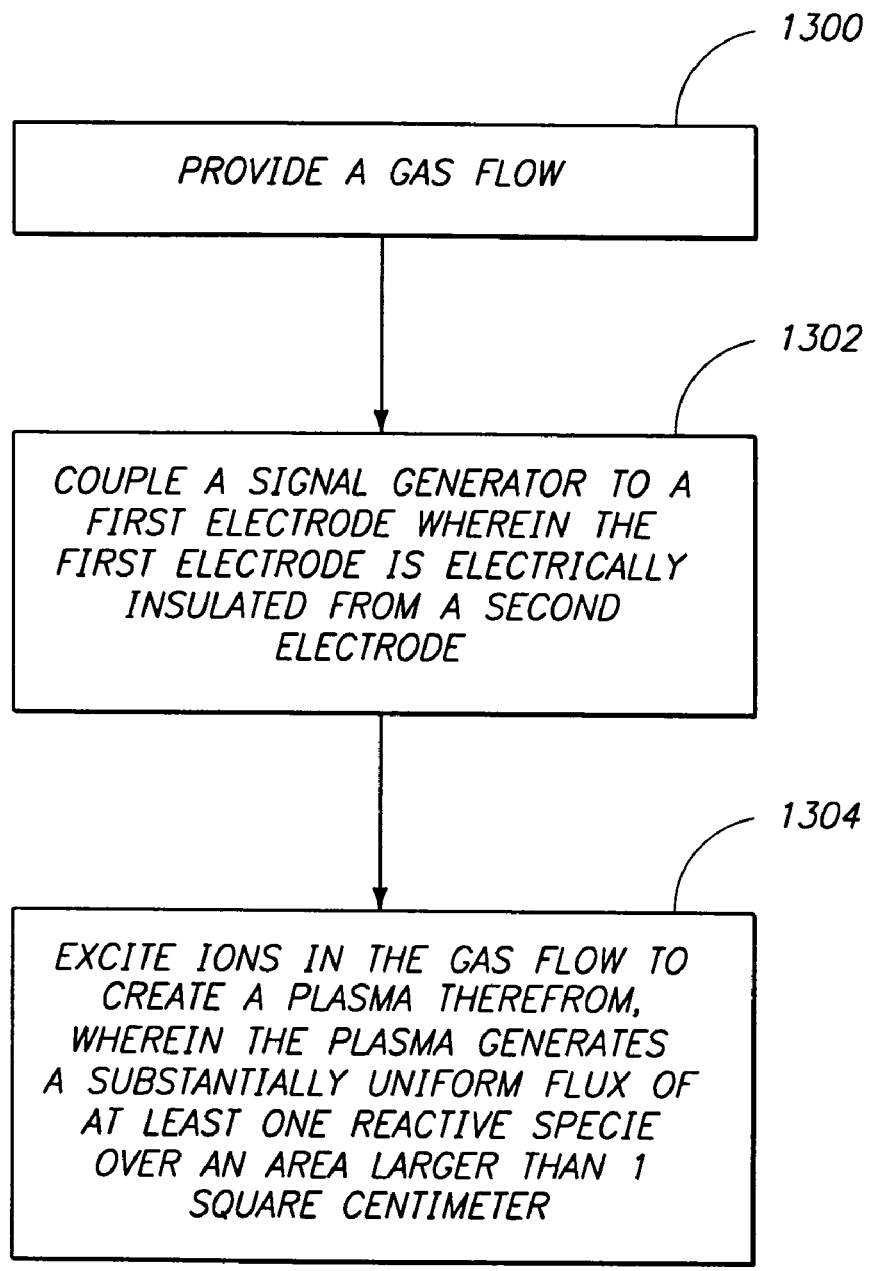
FIG. 13 is a flowchart illustrating the steps used in practicing the present invention.

FIG. 13 is a flowchart illustrating the steps used in practicing the present invention Block 1300 illustrates the step of providing a gas flow.

Block 1302 illustrates the step of coupling a signal generator to a first electrode wherein the first electrode is electrically insulated from a second electrode.

Block 1304 illustrates the step of exciting ions in the gas flow to create a plasma therefrom, wherein the plasma generates a substantially uniform flux of at least one reactive specie over an area larger than 1 $cm^2$.

CONCLUSION

Plasmas used in materials processing are categorized by their operating pressures. There are two main types of plasma sources: low-pressure plasma sources, operating between 0.01 and 10.0 Torr, and atmospheric-pressure plasma sources, operating at about 760 Torr. The present invention is novel in that it generates a substantially uniform flux of at least one reactive specie over an area larger than 1 $cm^2$. Further, the plasma flow device of the present invention operates over wide temperature and pressure ranges. Thus, the plasma flow device of the present invention bridges the gap between the other two sources, and provides the ability to deposit, etch, surface activate, sterilize, and/or clean with substantial uniformity over a large area simultaneously. Nevertheless, the plasma flow device is similar to low-pressure plasmas in one respect, in that the plasma flow device of the present invention produces a high concentration of reactive species at temperatures below 250° C., making it suitable for processing materials at relatively low temperatures.

The present invention offers several advantages relative to low-pressure plasma sources. The plasma flow device of the present invention has a simple, low-cost design that can be readily scaled to treat objects of almost any size and shape. By contrast, low-pressure devices require complicated RF antennas or magnets to create a uniform plasma above a given substrate, and are not easily scaled up for areas larger than about one square foot. In addition, the vacuum systems required to operate in the 0.01 Torr range are much more sophisticated than those needed in the 100 Torr range. All these factors make low-pressure plasma reactors much more expensive than the plasma flow device described herein.

The plasma flow device of the present invention also restricts the processing to the downstream portion of the process where the substrate is located. Low-pressure plasmas, on the other hand, completely fill the processing chamber, causing wear and tear on the components, and in the case of plasma-enhanced CVD, generating deposits all over the internal parts of the vacuum system. Contamination is a serious problem that requires numerous periodic cleaning steps, leading to a lot of down time for the device. By contrast, the plasma flow device remains relatively clean and free of corrosion and deposits during operation, yielding significant savings in cost.

The plasma flow device of the present invention may be operated in a way that prevents nearly all of the ions from contacting the substrate. In low-pressure plasmas, the ions normally impinge on the substrate, which may cause damage to sensitive features, such as the gate electrodes in metal-oxide-semiconductor field-effect transistors on silicon integrated circuits. The present invention provides operational advantages over previous designs, where downstream plasma processing is desired to eliminate ion-induced damage.

The present invention also offers several advantages relative to other atmospheric pressure plasma sources.

The plasma flow device of the present invention is readily scaled to provide a uniform plasma flow onto large surface area substrates, or substrates or work pieces of any size and shape simultaneously, without requiring translation of the substrate or work piece underneath the plasma beam. By contrast, atmospheric pressure plasmas described in the related art, including plasma torches, corona discharges, dielectric barrier discharges, cold plasma torches and plasma jets, process large areas with difficulty, and are not readily scaled up.

The plasma flow device of the present invention provides uniform contacting of a substrate, so that it may be cleaned, sterilized, surface activated, etched, or deposited upon at a uniform rate over the entire object. Many atmospheric pressure plasmas are, by their very nature, non-uniform. For example, a plasma torch or a plasma jet produces a tightly focussed beam of reactive species, which is difficult and inefficient to scale up. This can be overcome by translating the substrate underneath the plasma source, but this adds to the total cost of the system. Therefore, the plasma flow device is simpler, easier to operate, and less expensive than other atmospheric pressure plasma sources.

The plasma flow device of the present invention is well suited for low-temperature materials processing, between about 25 and 500° C. By contrast, plasma torches operate at neutral gas temperatures in excess of 4,000° C. Low-temperature processing is required in many applications. For example, silicon integrated circuits must be processed at temperatures below 400° C. Thus, the plasma flow device of the present invention offers significant advantages for this application.

The plasma flow device of the present invention is more efficient than the atmospheric pressure plasma jet described in the literature. Cooling water is not needed because the electrodes are cooled by the flow of the process gas around or through them. Furthermore, the electrode configuration used in the plasma flow source of the present invention consumes less power than the plasma jet. A comparison of the photoresist stripping ability of the two technologies has shown that the plasma flow source of the present invention can etch at least eight times faster for equivalent applied power and process conditions. This reduced power consumption yields a lower overall operating cost.

In summary, the present invention provides a method for creating a plasma and a plasma flow device. The method comprises providing a gas flow, coupling a signal generator to a first electrode wherein the first electrode is electrically insulated from a second electrode, and exciting ions in the gas flow to create a plasma therefrom, wherein the plasma generates a substantially uniform flux of at least one reactive specie over an area larger than 1 $cm^2$.

The device comprises a housing, wherein the housing provides a gas flow, a first electrode, electrically insulated from the housing, a second electrode, spaced from the first electrode and electrically insulated from the first electrode and electrically insulated from the housing, and a signal generator, coupled to the first electrode, wherein the signal generator excites ions in the gas flow to create a plasma therefrom substantially between the first electrode and the second electrode, wherein the plasma generates a substantially uniform flux of at least one reactive specie over an area larger than 1 $cm^2$.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for processing a substrate, comprising:
   (a) constraining a gas flow in a housing at a pressure of about atmospheric pressure;
   (b) coupling a signal generator to a first electrode that is electrically isolated from a second electrode, wherein the first and second electrodes have at least one perforation and are affixed to the housing so as to require substantially all the gas flow to pass between the first and second electrodes;
   (c) exciting the gas flow to create a plasma between the first and second electrodes; and
   (d) placing a substrate downstream of the electrodes, wherein the substrate is contacted by a substantially uniform flux of at least one reactive species generated by the plasma.

2. The method of claim 1, wherein the gas comprises a mixture of an inert gas and a molecular gas.

3. The method of claim 2, wherein the mixture comprises a flux substantially free of ionic species downstream of the first and second electrodes.

4. The method of claim 1, wherein the electrodes are spaced apart so as to create a gap between 0.1 and 20.0 mm.

5. The method of claim 1, wherein the substrate is placed downstream of the electrodes at a distance substantially between 1.0 to 20.0 mm.

6. The method of claim 1, wherein the plasma is created at temperatures below 250 degrees centigrade.

7. The method of claim 1, wherein the substrate has a shape of a substantially circular disk, square, rectangle or polygon.

8. The method of claim 1, wherein the substrate is a large sheet that passes beneath the electrodes.

9. The method of claim 1, wherein the first electrode is substantially concentric with the second electrode, and the plasma generated therebetween is directed in an inward direction towards the substrate.

10. The method of claim 9, wherein the substrate is a wire, thread, fiber, pipe, tube or rod.

11. The method of claim 1, wherein the first electrode is substantially concentric with the second electrode, and the plasma generated therebetween is directed in an outward direction towards the substrate.

12. The method of claim 11, wherein the substrate is a pipe, tube or cylinder.

13. The method of claim 1, wherein the plasma emits at least one reactive species that etches the substrate.

14. The method of claim 1, wherein the plasma emits at least one reactive species that cleans the substrate.

15. The method of claim 1, wherein the plasma emits at least one reactive species that when combined with a chemical precursor deposits material on the substrate.

16. The method of claim 1, wherein the plasma emits at least one reactive species that sterilizes the substrate.

17. The method of claim 1, wherein the plasma emits at least one reactive species that activates a surface of the substrate.

18. The method of claim 2, wherein the inert gas is helium or argon.

19. The method of claim 2, wherein the molecular gas contains elements selected from a group comprising hydrogen, carbon, nitrogen, oxygen, fluorine, phosphorus, sulfur, chlorine, and arsenic.

20. The method of claim 1, wherein the signal generator is a radio frequency generator.

21. A method comprising:
   operating a plasma flow device;
   the plasma flow device having
      a) a housing, configured to receive and constrain a gas flow, wherein the housing includes a gas inlet,
      b) a first electrode having at least one perforation,
      c) a second electrode having at least one perforation, the second electrode being spaced apart from the first electrode and being electrically insulated therefrom,
      d) the first and second electrodes being sized and affixed relative to the housing so as to require substantially all the gas flow to pass through the first and second electrodes, and
      e) a signal generator, coupled to at least one of the first electrode or second electrode, and
      f) an outlet opening out of the device;
   operating the device to create a plasma with a pressure of about atmospheric pressure between the first electrode and the second electrode; and
   passing a plasma effluent from the second electrode through the outlet.

22. The method of claim 21, wherein operating the device comprises exciting ions in the gas flow to create the plasma having a temperature below 250 degrees centigrade.

23. The method of claim 21, further comprising:
   combining a chemical precursor with the plasma effluent; and
   depositing material onto a substrate.

24. The method of claim 21, further comprising etching a substrate with the plasma effluent.

25. The method of claim 21, further comprising cleaning a substrate with the plasma effluent.

26. The method of claim 21, further comprising sterilizing a substrate with the plasma effluent.

27. The method of claim 21, further comprising surface activating a substrate with the plasma effluent.

28. The method of claim 21, further comprising:
   introducing gas molecules into the gas flow; and
   producing a reactive species from the gas molecules.

29. The method of claim 21, further comprising:
   introducing oxygen molecules into the gas flow; and
   producing a reactive species from the oxygen molecules.

30. The method of claim 21, further comprising introducing an inert gas into the gas flow.

31. The method of claim 21, further comprising operating the device without an attached substrate processing chamber.

32. The method of claim 21, further comprising directing the plasma effluent onto a substrate that is not contained within a processing chamber.

* * * * *